(12) United States Patent
Lin et al.

(10) Patent No.: US 12,218,226 B2
(45) Date of Patent: Feb. 4, 2025

(54) METHODS OF FABRICATING SEMICONDUCTOR DEVICES HAVING GATE-ALL-AROUND STRUCTURE WITH INNER SPACER LAST PROCESS

(71) Applicant: Taiwan Semiconductor Manufacturing Company, Ltd., Hsinchu (TW)

(72) Inventors: Chun-Hsiung Lin, Zhubei (TW); Pei-Hsun Wang, Kaohsiung (TW); Chih-Hao Wang, Baoshan Township, Hsinchu County (TW); Kuo-Cheng Ching, Zhubei (TW); Jui-Chien Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 611 days.

(21) Appl. No.: 17/081,365

(22) Filed: Oct. 27, 2020

(65) Prior Publication Data
US 2021/0066473 A1    Mar. 4, 2021

Related U.S. Application Data

(62) Division of application No. 16/282,214, filed on Feb. 21, 2019, now Pat. No. 10,825,919.

(51) Int. Cl.
| | |
|---|---|
| *H01L 29/66* | (2006.01) |
| *H01L 21/8234* | (2006.01) |
| *H01L 29/06* | (2006.01) |
| *H01L 29/417* | (2006.01) |
| *H01L 29/78* | (2006.01) |

(52) U.S. Cl.
CPC .. *H01L 29/6681* (2013.01); *H01L 21/823431* (2013.01); *H01L 21/823481* (2013.01); *H01L 29/0653* (2013.01); *H01L 29/41791* (2013.01); *H01L 29/785* (2013.01); *H01L 2029/7858* (2013.01)

(58) Field of Classification Search
CPC ......... H01L 29/6681; H01L 21/823431; H01L 21/823481; H01L 29/0653; H01L 29/41791; H01L 29/785; H01L 2029/7858
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,324,617 B1 * | 4/2016 | Akarvardar | H01L 21/02428 |

(Continued)

FOREIGN PATENT DOCUMENTS

CN          112151609 A    * 12/2020    ......... H01L 21/8221

*Primary Examiner* — Peter Bradford
(74) *Attorney, Agent, or Firm* — Birch, Stewart, Kolasch & Birch, LLP

(57) ABSTRACT

A semiconductor device is provided. The semiconductor device includes a plurality of channel layers stacked over a semiconductor substrate and spaced apart from one another, a source/drain structure adjoining the plurality of channel layers, a gate structure wrapping around the plurality of channel layers, and a first inner spacer between the gate structure and the source/drain structure and between the plurality of channel layers. The first inner spacer is made of an oxide of a semiconductor material.

20 Claims, 35 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,837,414 B1 | 12/2017 | Balakrishman et al. | |
| 2005/0023619 A1 | 2/2005 | Orlowski et al. | |
| 2008/0090362 A1* | 4/2008 | Kim | H01L 21/823412 |
| | | | 257/E21.442 |
| 2009/0194826 A1 | 8/2009 | Ernst et al. | |
| 2014/0145247 A1* | 5/2014 | Cheng | H01L 27/0886 |
| | | | 438/424 |
| 2016/0027870 A1* | 1/2016 | Cheng | H01L 29/66545 |
| | | | 438/157 |
| 2017/0005188 A1* | 1/2017 | Cheng | H01L 29/42392 |
| 2017/0040321 A1* | 2/2017 | Mitard | H01L 29/165 |
| 2017/0317213 A1* | 11/2017 | Park | H01L 29/785 |
| 2018/0315667 A1* | 11/2018 | Kwon | H01L 29/401 |
| 2019/0067122 A1 | 2/2019 | Cheng et al. | |
| 2019/0067125 A1 | 2/2019 | Chiang et al. | |
| 2019/0067452 A1 | 2/2019 | Cheng et al. | |
| 2019/0097023 A1 | 3/2019 | Wu | |
| 2019/0148515 A1 | 5/2019 | Cheng et al. | |
| 2019/0164838 A1* | 5/2019 | Chang | H01L 21/823437 |
| 2019/0181224 A1* | 6/2019 | Zhang | H01L 29/66553 |
| 2019/0189769 A1* | 6/2019 | Basker | H01L 29/167 |
| 2019/0221638 A1* | 7/2019 | Reznicek | H01L 29/66439 |
| 2019/0348498 A1 | 11/2019 | Cheng et al. | |
| 2020/0044061 A1 | 2/2020 | Cheng et al. | |

\* cited by examiner

METHODS OF FABRICATING SEMICONDUCTOR DEVICES HAVING GATE-ALL-AROUND STRUCTURE WITH INNER SPACER LAST PROCESS

PRIORITY CLAIM AND CROSS-REFERENCE

This application is a divisional application of U.S. patent application Ser. No. 16/282,214, filed on Feb. 21, 2019, entitled of "METHODS OF FABRICATING SEMICONDUCTOR DEVICES HAVING GATE-ALL-AROUND STRUCTURE WITH INNER SPACER LAST PROCESS," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor integrated circuit (IC) industry has experienced exponential growth. Technological advances in IC materials and designs have produced generations of ICs where each generation has smaller and more complex circuits than the previous generation. As the semiconductor IC industry has progressed into nanometer process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in the fin channel and source/drain regions are formed. A gate structure is formed over and along the sides of the fin (e.g., wrapping) utilizing the advantage of the increased surface area of the channel to produce faster, more reliable, and better-controlled semiconductor transistor devices. However, there are still various challenges in the fabrication of FinFET devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C, 2D, 2E-1, 2F-1 2G, 2H, and 2I show cross-sectional views of respective intermediate structures at various stages of an exemplary method for fabricating a semiconductor device taken along line I-I in FIG. 1, in accordance with some embodiments.

FIGS. 2A-2, 2B-2, 2E-2 and 2F-2 show cross-sectional views of respective intermediate structures at several stages of an exemplary method for fabricating a semiconductor device taken along line II-II in FIG. 1, in accordance with some embodiments.

FIGS. 2A-3 and 2B-3 show cross-sectional views of respective intermediate structures at several stages of an exemplary method for fabricating a semiconductor device taken along line III-III in FIG. 1, in accordance with some embodiments.

FIGS. 3A, 3B-1, 3C-1, 3D-1, 3E, 3F and 3G show cross-sectional views of respective intermediate structures at various stages of an exemplary method for fabricating a semiconductor device taken along line I-I in FIG. 1, in accordance with some embodiments.

FIGS. 3B-2, 3C-2 and 3D-2 show cross-sectional views of respective intermediate structures at several stages of an exemplary method for fabricating a semiconductor device taken along line II-II in FIG. 1, in accordance with some embodiments.

DETAILED DESCRIPTION

Figure 1:
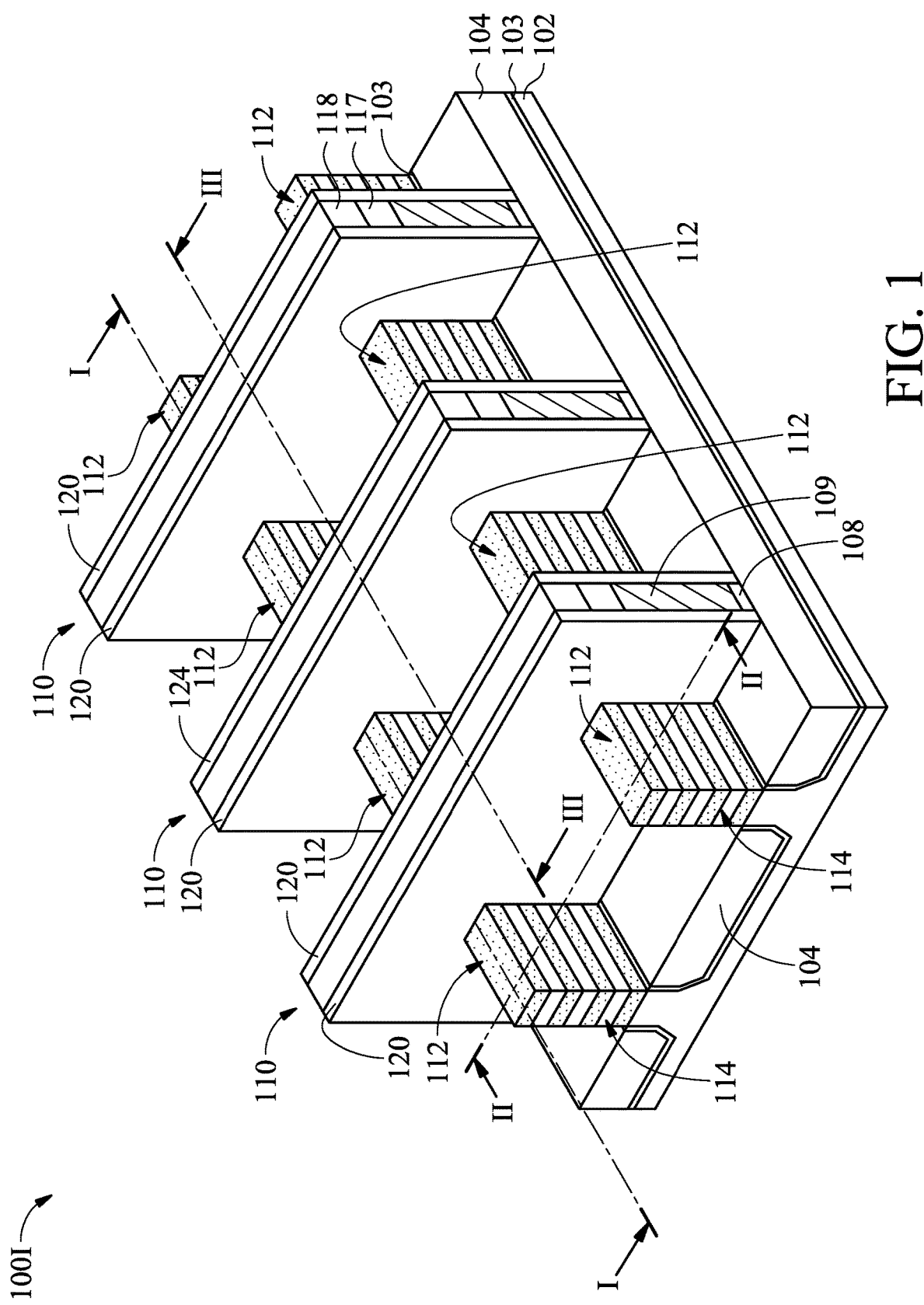
FIG. 1 shows a perspective view of an intermediate structure at one stage of an exemplary method for fabricating a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments disclosed herein relate generally to fabricating semiconductor devices having a gate-all-around (GAA) structure with inner spacer last process. The semiconductor devices are for example Fin Field Effect Transistor (FinFET) devices. The inner spacers are disposed between the GAA structure and source and drain structures. The inner spacers of the embodiments of the disclosure are formed after the source and drain structures are epitaxially grown on a continuous semiconductor surface. The continuous semiconductor surface is constituted of sidewalk of multiple semiconductor layers of a fin stack. Next, portions of some semiconductor layers of the fin stack are removed to form spaces between the other semiconductor layers that can be referred to as channel layers. The remaining portions of the semiconductor layers on opposite sides of the spaces are oxidized to form the inner spacers. Afterwards, a gate structure is formed to fill the spaces and to surround the channel layers to form the GAA structure.

According to embodiments of the disclosure, the source and drain structures are epitaxially grown on a continuous semiconductor surface that has crystal orientation. Therefore, the defects produced during the epitaxial growth process in the source and drain structures are reduced. The performance of the semiconductor devices of the disclosure can be improved. Moreover, according to the embodiments of the disclosure, the inner spacers are formed after the processes of forming the source and drain structures. Therefore, the inner spacers are not damaged by the etching, cleaning and epitaxial growth processes of forming the source and drain structures. The semiconductor devices of the disclosure without inner spacer loss can enhance the yield of fabrication.

The foregoing broadly outlines some aspects of the embodiments described herein. Some embodiments described herein are described in the context of FinFET devices, and more particularly, in the context of forming inner spacers between a GAA structure and epitaxial source and drain structures in the FinFET devices. The inner spacers are formed after the epitaxial source and drain structures are formed, which may be referred to as inner spacer last process. Some variations of the exemplary methods and structures are described. A person having ordinary skill in the art will readily understand other modifications may be made that are contemplated within the scope of other embodiments. Implementations of some aspects of the present disclosure may be used in other processes and/or in other devices. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 illustrates a perspective (three-dimensional) view of an intermediate structure at one stage of an exemplary method for fabricating a semiconductor device, in accordance with some embodiments. The intermediate structure of FIG. 1 is a semiconductor device 100I such as simplified FinFETs with dummy gate structures 110. Other aspects not illustrated in or described with respect to FIG. 1 may become apparent from the following figures and description.

The structure in FIG. 1 may be electrically connected or coupled in a manner to operate one or more transistors, for example six transistors.

The semiconductor device 100I includes multiple fin structures 114 protruding from a semiconductor substrate 102. The semiconductor substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The semiconductor substrate 102 may be made of silicon or another semiconductor material. For example, the semiconductor substrate 102 is a silicon wafer. In some examples, the semiconductor substrate 102 is made of a compound semiconductor such as silicon germanium (SiGe), silicon carbide (SiC), gallium arsenic (GaAs), indium arsenide (InAs), or indium phosphide (InP). In some examples, the semiconductor substrate 102 is made of an alloy semiconductor such as GaAsP, AlInAs, AlGaAs, GaInAs, GaInP, or GaInAsP.

Referring to FIG. 1, multiple isolation structures 104 are formed on the semiconductor substrate 102, and each of the fin structures 114 protrudes above the isolation structures 104, in accordance with some embodiments. Details of the processes and the configurations for forming the fin structures 114 are described below in reference to the cross-sectional views of FIGS. 2A-1 and 2A-2. The fin structure 114 is disposed between the isolation structures 104 and surrounded by the isolation structures 104. The isolation structure 104 is, for example a shallow-trench-isolation (STI) structure, which surrounds the bottom portions of the fin structures 114. The isolation structure 104 is disposed between neighboring pairs of fin structures 114. The isolation structure 104 is formed from an insulating material such as silicon oxide, silicon nitride, silicon oxynitride, fluoride-doped silicate glass (FSG), or another low dielectric constant (low-k) dielectric material. The isolation structure 104 may be formed by filling trenches between the fin structures 114 with the insulating material using a deposition process, such as chemical vapor deposition (CVD) process, flowable CVD (FCVD) process, spin-on-glass (SOG) process, or another applicable process, and then the filled insulating material is recessed. The trenches between the fin structures 114 may be formed by etching the semiconductor substrate 102 and using a hard mask on the fin structures 114 to serve as an etching mask.

Moreover, a liner 103 is formed between the isolation structures 104 and the semiconductor substrate 102. The liner 103 is conformally deposited on the sidewalls of the fin structures 114, and is disposed between the isolation structures 104 and the bottom portions of the fin structures 114. The material of the liner 103 may be silicon oxide, silicon nitride or silicon oxynitride. The liner 103 may be deposited using CVD process, physical vapor deposition (PVD) process or atomic layer deposition (ALD) process. The deposited layer of the liner 103 is recessed together with the filled insulating material of the isolation structures 104.

In addition, multiple dummy gate structures 110 are formed across the fin structures 114, along the sidewalls and over the top surfaces of the fin structures 114, as shown in FIG. 1 in accordance with some embodiments. The dummy gate structures 110 are also formed on the isolation structures 104. The longitudinal direction of the dummy gate structures 110 is perpendicular to the longitudinal direction of the fin structures 114. In some embodiments of the disclosure, each of the dummy gate structures 110 will be replaced with a replacement gate structure in a gate-last process to form a gate-all-around (GAA) structure.

Each of the dummy gate structures 110 includes a dummy gate dielectric layer 108 and a dummy gate electrode layer 109 over the dummy gate dielectric layer 108. In some embodiments, the dummy gate electrode layer 109 is made of poly-silicon. The dummy gate dielectric layer 108 may be made of silicon oxide, silicon nitride, silicon oxynitride or another low dielectric constant (low-k) dielectric material. The dummy gate dielectric layer 108 and the dummy gate electrode layer 109 are formed independently using a deposition process, such as CVD, PVD ALD, high density plasma CVD (HDPCVD), metal organic CVD (MOCVD), or plasma enhanced CVD (PECVD) process. Then, those deposited layers of the dummy gate dielectric layer 108 and the dummy gate electrode layer 109 are patterned into the dummy gate structures 110 using photolithography and etching processes. The etching process is anisotropic and may include a reactive ion etch (RIE), neutral beam etch (NBE), or another suitable etching process. In some embodiments, the dummy gate dielectric layer 108 and the dummy gate electrode layer 109 are patterned together. In some other embodiments, the dummy gate electrode layer 109 the dummy gate dielectric layer 108 and the dummy gate electrode layer 109 are patterned independently.

Referring to FIG. 1, gate spacers 120 are formed along the sidewalls of the dummy gate structures 110 and over the fin structures 114, in accordance with some embodiments. The gate spacers 120 are also formed on the isolation structures 104. The gate spacers 120 may be formed by conformally depositing one or more spacer layers and anisotropically etching the one or more spacer layers. The one or more spacer layers may include silicon oxide ($SiO_2$), silicon nitride (SiN or $Si_3N_4$), silicon oxynitride (SiON), silicon carbon nitride (SiCN), or a combination thereof, and may be deposited by CVD, ALD or another deposition process. The etching process may include a RIE, NBE, or another etching process. Details of the processes for forming the dummy gate structures 110 and the gate spacers 120 are described below in reference to the cross-sectional views shown in FIGS. 2A-1 and 2A-3.

Source and drain regions 112 are located in active areas of the fin structures 114, on opposite sides of the dummy gate structure 110, as shown in FIG. 1 in accordance with some embodiments. Some source and drain regions 112 may be shared between two neighboring transistors, such as through coalescing the regions by epitaxial growth. For example, the neighboring FinFETs with the shared source and drain regions may be implemented as two functional transistors. Other configurations in other examples may implement other numbers of functional transistors. In some embodiments, the source and drain regions 112 are epitaxial source and drain structures. Details of the processes for forming epitaxial source and drain structures as the source and drain regions 112 are described below in reference to the cross-sectional views shown in FIGS. 2E-1 and 2E-2.

Furthermore, FIG. 1 illustrates a reference cross-section along line I-I that is used in FIGS. 2A-1, 2B-1, 2C, 2D, 2E-1, 2F-1, 2G, 2H, 2I, 3A, 3B-1, 3C-1, 3D-1, 3E, 3F, 3G, 4A, 4B, 4C, 4D and 4E. Line I-I is on a plane that is perpendicular to the dummy gate structures 110 and along the fin structure 114. FIG. 1 also illustrates a reference cross-section along line II-II that is used in FIGS. 2A-2, 2B-2, 2E-2, 2F-2, 3B-2, 3C-2, 3D-2, 5A, 5B, 5C and 5D. Line II-II is on a plane that is perpendicular to the fin structures 114 and over the isolation structures 104. FIG. 1 further illustrates a reference cross-section along line III-III that is used in FIGS. 2A-3 and 2B-3. Line III-III is on a plane that is perpendicular to the dummy gate structures 110 and over the isolation structure 104.

In FIG. 1, for ease of depicting the figure, some components or features (for example, a contact etch stop layer and an interlayer dielectric layer) illustrated in the following figures are omitted to avoid obscuring other components or features. In addition, the details of the fin structures 114, the gate spacers 120, epitaxial source and drain structures formed in the source and drain regions 112 and other features used is the processes for fabricating semiconductor devices having a GAA structure with inner spacers are simplified. Details of the materials and processes for fabricating the semiconductor devices according to embodiments of the disclosure are described below.

FIGS. 2A-1, 2A-2 and 2A-3 illustrates cross-sectional views of an intermediate structure at one stage of fabricating a semiconductor device 100 taken along line I-I, line II-II and line III-III in FIG. 1, respectively, in accordance with some embodiments. Firstly, a semiconductor substrate 102 such as a silicon wafer is provided. Next, multiple first semiconductor layers 114S-1 and multiple second semiconductor layers 114S-2 are stacked alternately on the semiconductor substrate 102. In some examples, the total number of layers in the stack of first semiconductor layers 114S-1 and second semiconductor layers 114S-2 is between three and ten. For example, there may be five layers or eight layers. The first semiconductor layers 114S-1 and the second semiconductor layers 114S-2 are made of different materials. The first semiconductor layers 114S-1 include silicon or silicon germanium. The second semiconductor layers 114S-2 also include silicon or silicon germanium. In some embodiments, the first semiconductor layers 114S-1 are made of silicon, and the second semiconductor layers 114S-2 are made of silicon germanium ($Si_{1-x}Ge_x$). In some examples, the molar ratio x of Ge in the second semiconductor layers 114S-2 is in a range from about 0.10 to about 0.40. In some other embodiments, the first semiconductor layers 114S-1 are made of silicon germanium, and the second semiconductor layers 114S-2 are made of silicon.

Moreover, in some embodiments, the first semiconductor layer 114S-1 is directly formed on the semiconductor substrate 102, and then the second semiconductor layer 114S-2 is formed on the first semiconductor layer 114S-1. In some other embodiments, the second semiconductor layer 114S-2 is directly formed on the semiconductor substrate 102, and then the first semiconductor layer 114S-1 is formed on the second semiconductor layer 114S-2. The first semiconductor layers 114S-1 and the second semiconductor layers 114S-2 may be formed independently by epitaxial growth process. In some examples, the total thickness of the stacked semiconductor layers 114S-1 and 114S-2 is in a range from about 40 nm to about 70 nm.

The semiconductor substrate 102 and the stacked semiconductor layers 114S-1 and 114S-2 are then patterned together using photolithography and etching processes to form multiple trenches in the semiconductor substrate 102 and in the stacked semiconductor layers 114S-1 and 114S-2. A patterned hard mask (not shown) is formed on the stacked semiconductor layers 114S-1 and 114S-2 and is used as an etching mask for forming fin stacks 114S and fins 102F. The etching process may include a reactive ion etch (RIE), neutral beam etch (NBE), inductive coupled plasma (ICP) etch, or a combination thereof. Each of the fin stacks 114S is formed on the respective fin 102F. The fin 102F and the fin stack 114S are together referred to as the fin structure 114 of FIG. 1. The fin structures 114 are formed and protrude from the semiconductor substrate 102. Each of the trenches is between neighboring pairs of fin structures 114.

Next, a liner material layer is conformally deposited in the trenches, on the semiconductor substrate 102 and along the sidewalk and the top surfaces of the fin structures 114. The liner material layer may be made of silicon oxide, silicon nitride or silicon oxynitride. The liner material layer may be deposited using CVD, PVD or ALD process. Afterwards, the trenches between the fin structures 114 are filled with an insulating material on the liner material layer. In some examples, the insulating material is for example silicon oxide, silicon nitride, silicon oxynitride, fluoride-doped silicate glass (FSG), or another low dielectric constant (low-k) dielectric material. The trenches may be filled with the insulating material using a deposition process, such as CVD, flowable CVD (FCVD), spin-on-glass (SOG) process, or another applicable process.

Figures 1, 2A:
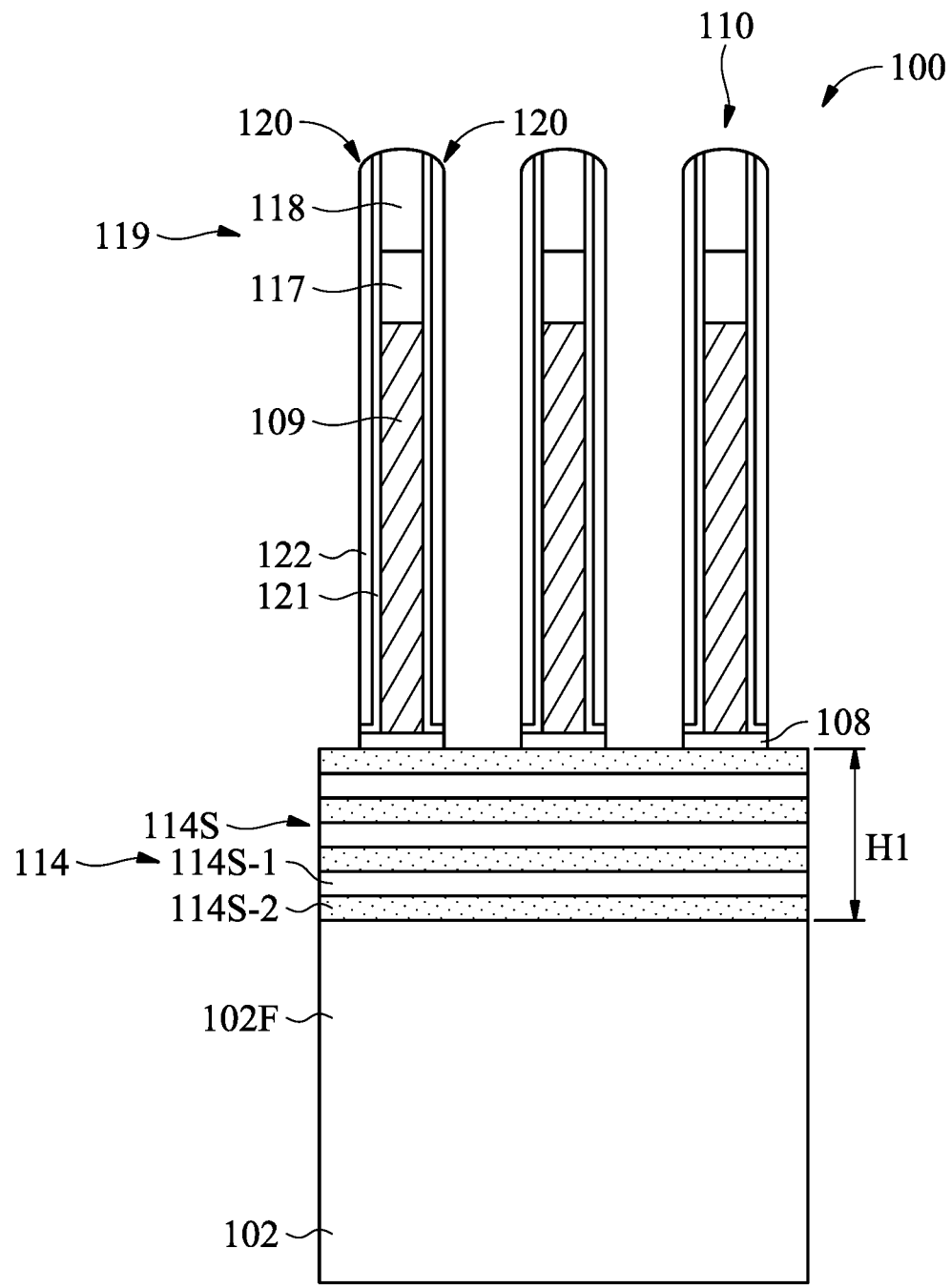
Figures 2, 2A:
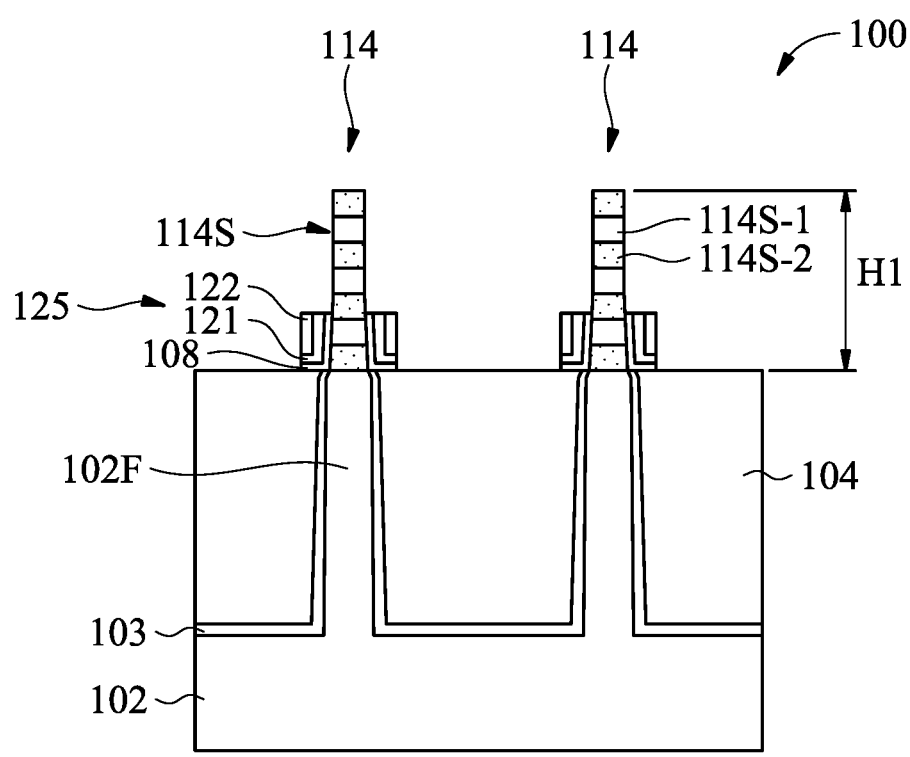

After the deposition process, the insulating material and the liner material layer are recessed together using an etching process to form the isolation structure 104 and the liner 103 in the trenches, as shown in FIGS. 1 and 2A-2 in accordance with some embodiments. In some instances, the top surfaces of the isolation structure 104 and the liner 103 are at the same level of the top surfaces of the fins 102F. The isolation structure 104 is for example a shallow-trench-isolation (STI) structure that surrounds the fin 102F. The fin stacks 114S protrude from the isolation structures 104. In some examples, the fin stack 114S has a height H1 that is in a range from about 50 nm to about 70 nm.

Afterwards, a dummy gate dielectric layer 108 is deposited on the fin stacks 114S and on the isolation structure 104, as shown in FIGS. 2A-1 and 2A-3 in accordance with some embodiments. The dummy gate dielectric layer 108 is also deposited on the top surface and the sidewalk of the fin stack 114S, as shown in FIG. 2A-2 in accordance with some embodiments. Next, a dummy gate electrode layer 109 is deposited on the dummy gate dielectric layer 108. In some examples, the dummy gate dielectric layer 108 is made of silicon oxide, and the dummy gate electrode layer 109 is made of poly-silicon.

A first hard mask 117 and a second hard mask 118 are patterned and formed on the dummy gate electrode layer 109. The first hard mask 117 and the second hard mask 118 are together referred to as a hard mask feature 119 that is used as an etching mask in an etching process for patterning the dummy gate electrode layer 109. In some examples, the first hard mask 117 is made of silicon carbon nitride (SiCN), silicon oxycarbide (SiOC), silicon oxycarbon nitride (SiOCN) or silicon nitride (SiN or $Si_3N_4$). The second hard mask 118 may be made of silicon oxide ($SiO_2$). The first hard mask 117 and the second hard mask 118 are formed using deposition, photolithography and etching processes. The deposition process may include CVD, PVD or another deposition process. The etching process may include a RIE, NBE, or another etching process.

In some embodiments, the dummy gate dielectric layer 108 is not patterned after the dummy gate electrode layer 109 is patterned. A first spacer layer 121 and a second spacer layer 122 are then conformally deposited on the second hard mask 118, along the sidewalls of the second hard mask 118, the first hard mask 117 and the dummy gate electrode layer 109, and on the dummy gate dielectric layer 108. In some other embodiments, the dummy gate dielectric layer 108 is patterned together with the dummy gate electrode layer 109, and the first spacer layer 121 is in direct contact with the fin stack 114S.

In addition, the first spacer layer 121 and the second spacer layer 122 are also conformally deposited on the dummy gate dielectric layer 108, along the top surface and the sidewalls of the fin stack 114S, and over the isolation structure 104. In some other embodiments, the dummy gate dielectric layer 108 is patterned together with the dummy gate electrode layer 109, and the dummy gate dielectric layer 108 of FIG. 2A-2 is removed. The first spacer layer 121 and the second spacer layer 122 may be in direct contact with the fin stack 114S and the isolation structure 104.

In some examples, the first spacer layer 121 is made of a low dielectric constant (low-k) dielectric material that has a k-value lower than the k-value (about 3.9) of $SiO_2$. The material of the first spacer layer 121 includes silicon nitride (SiN or $Si_3N_4$), silicon carbon nitride (SiCN), silicon oxynitride (SiON), silicon oxycarbide (SiOC) or silicon oxycarbon nitride (SiOCN). In some examples, the first spacer layer 121 has a thickness that is in a range from about 1 nm to about 4 nm. The material of the second spacer layer 122 includes silicon oxide ($SiO_2$), silicon oxycarbon nitride (SiOCN) or silicon oxycarbide (SiOC). In some examples, the second spacer layer 122 has a thickness that is in a range from about 3 nm to about 8 nm. The first spacer layer 121 and the second spacer layer 122 may be deposited respectively by CVD, PECVD, ALD or another deposition process.

The first spacer layer 121 and the second spacer layer 122 are then etched using an anisotropic etching process to form gate spacers 120 on the sidewalls of the dummy gate electrode layer 109, the first hard mask 117 and the second hard mask 118, as shown in FIGS. 2A-1 and 2A-3 in accordance with some embodiments. The gate spacers 120 may include one or more spacer layers, and are not limited to the two spacer layers 121 and 122. For example, the gate spacers 120 may include three spacer layers those are made of different materials and have different thicknesses from each other.

The first spacer layer 121, the second spacer layer 122 and the dummy gate dielectric layer 108 may have remaining portions as shown in FIG. 2A-2, on the sidewalls of the fin stack 114S (FIG. 2A-2), in accordance with some embodiments. The remaining portions of the first spacer layer 121, the second spacer layer 122 and the dummy gate dielectric layer 108 may be referred to as fin sidewall spacers 125. In some examples, fin sidewall spacers 125 have a height H2 that is in a range from greater than 0 nm to about 30 nm. In some other embodiments, the first spacer layer 121 and the second spacer layer 122 and the dummy gate dielectric layer 108 on the top surface and the sidewalls of the fin stack 114S are completely removed. In some examples, the fin stack 114S is simultaneously etched with the first spacer layer 121 and the second spacer layer 122 by an anisotropic etching process. There may be no remaining portions on the sidewalls of the fin stack 114S, and the height H2 is 0 nm.

Figures 2, 2A, 3:
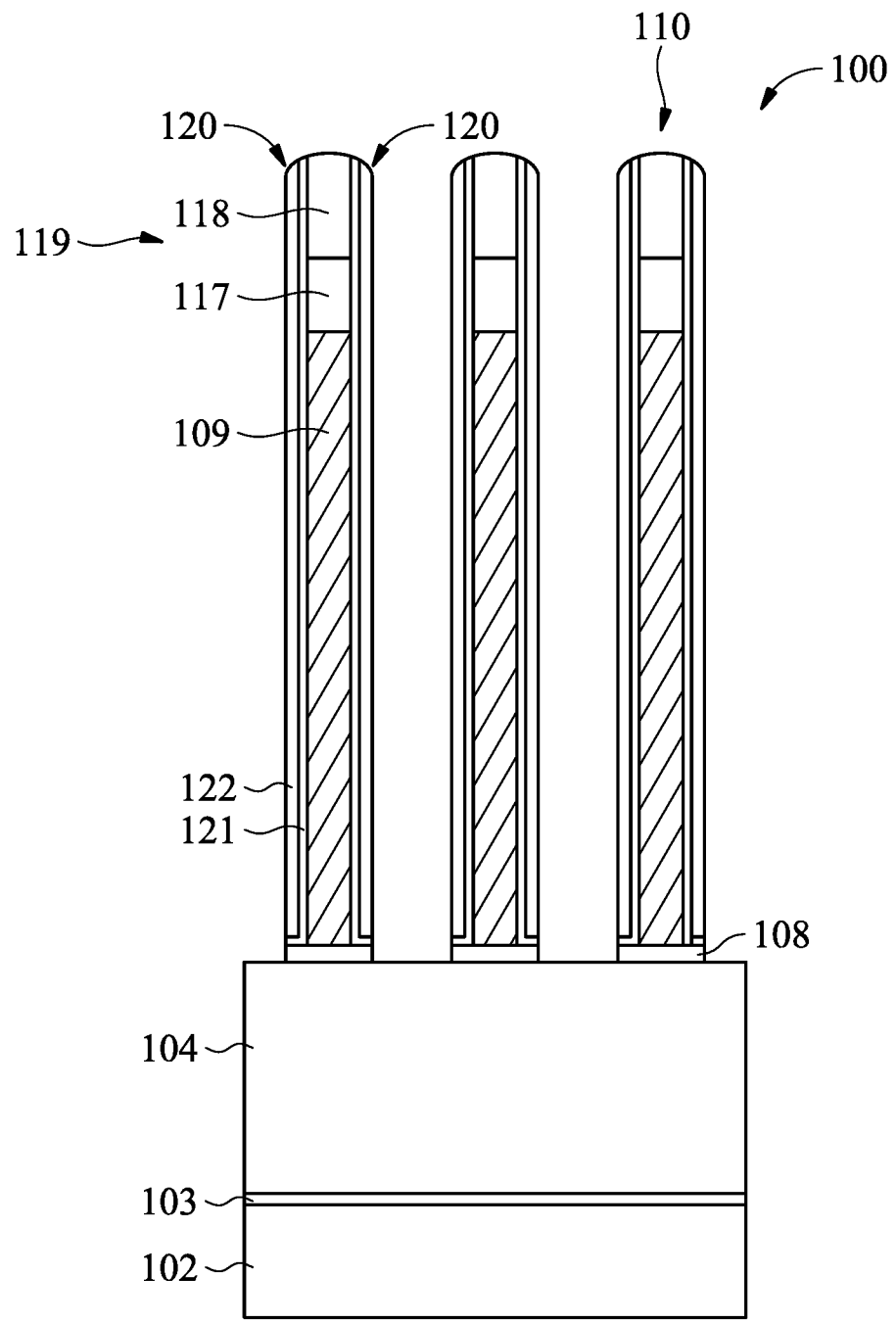
Figures 1, 2B:
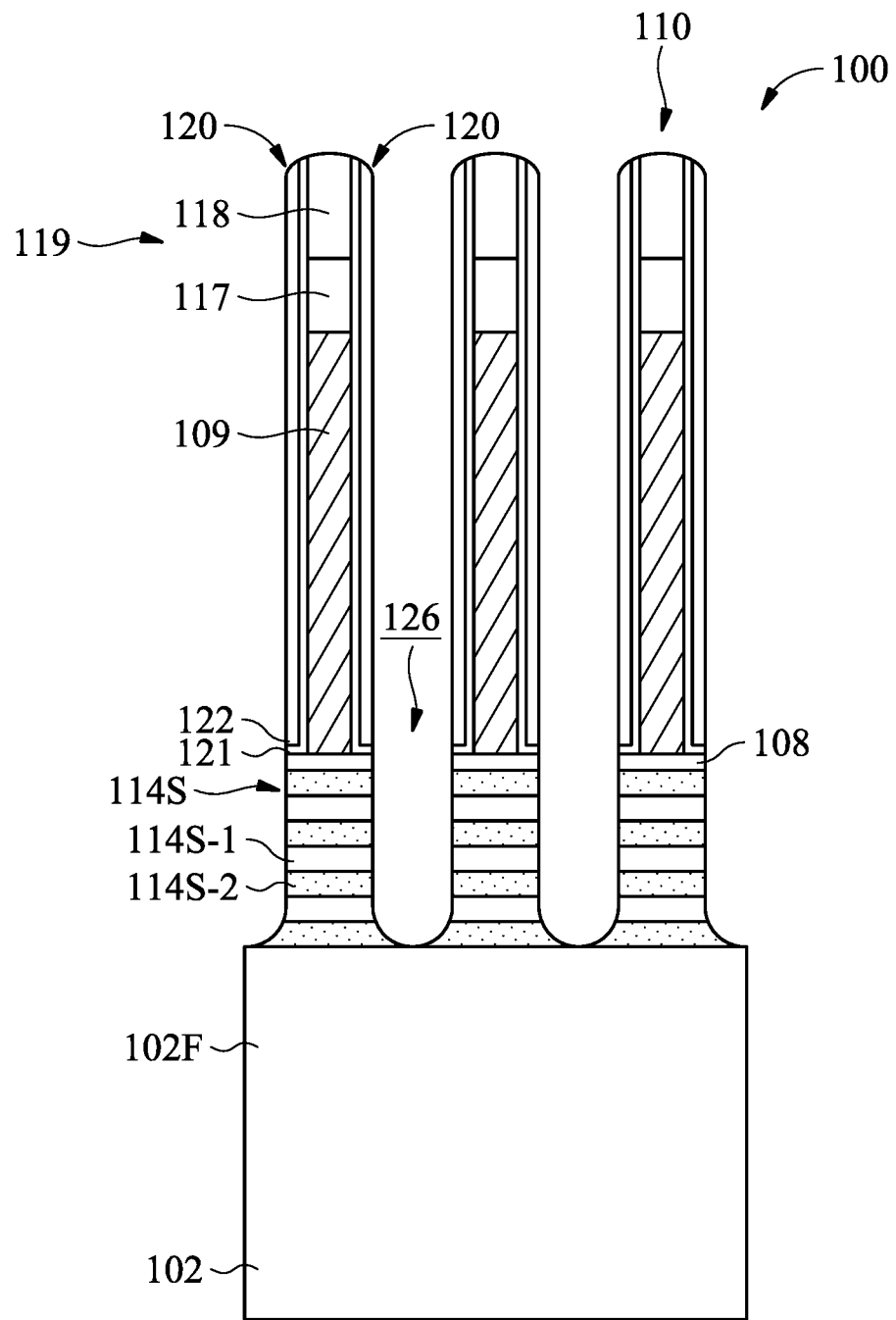
Figures 2, 2B:
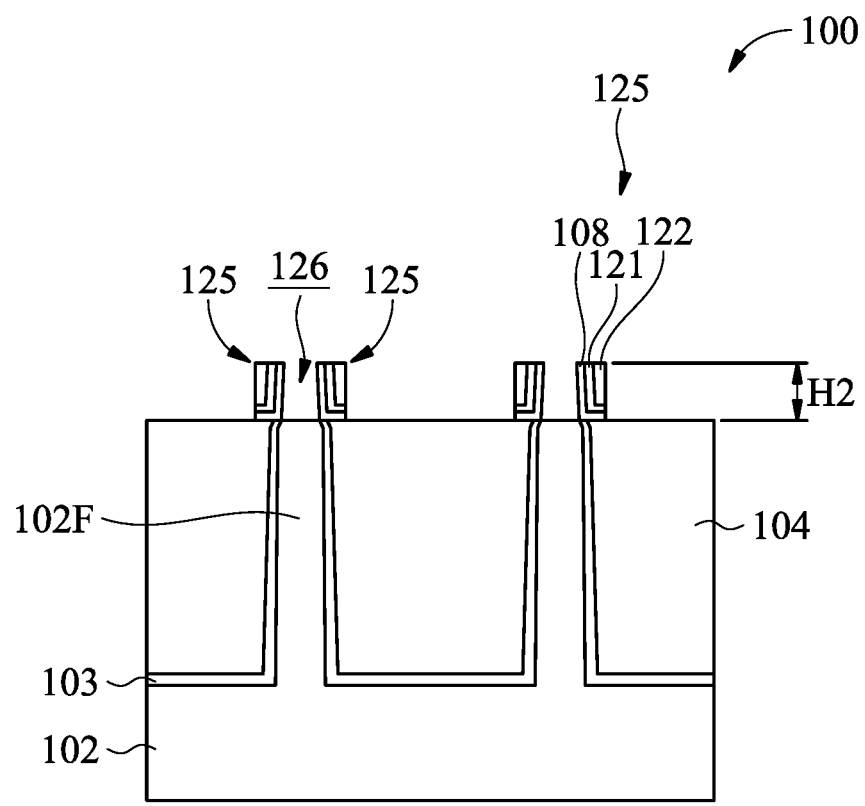
Figures 2, 2B, 3:
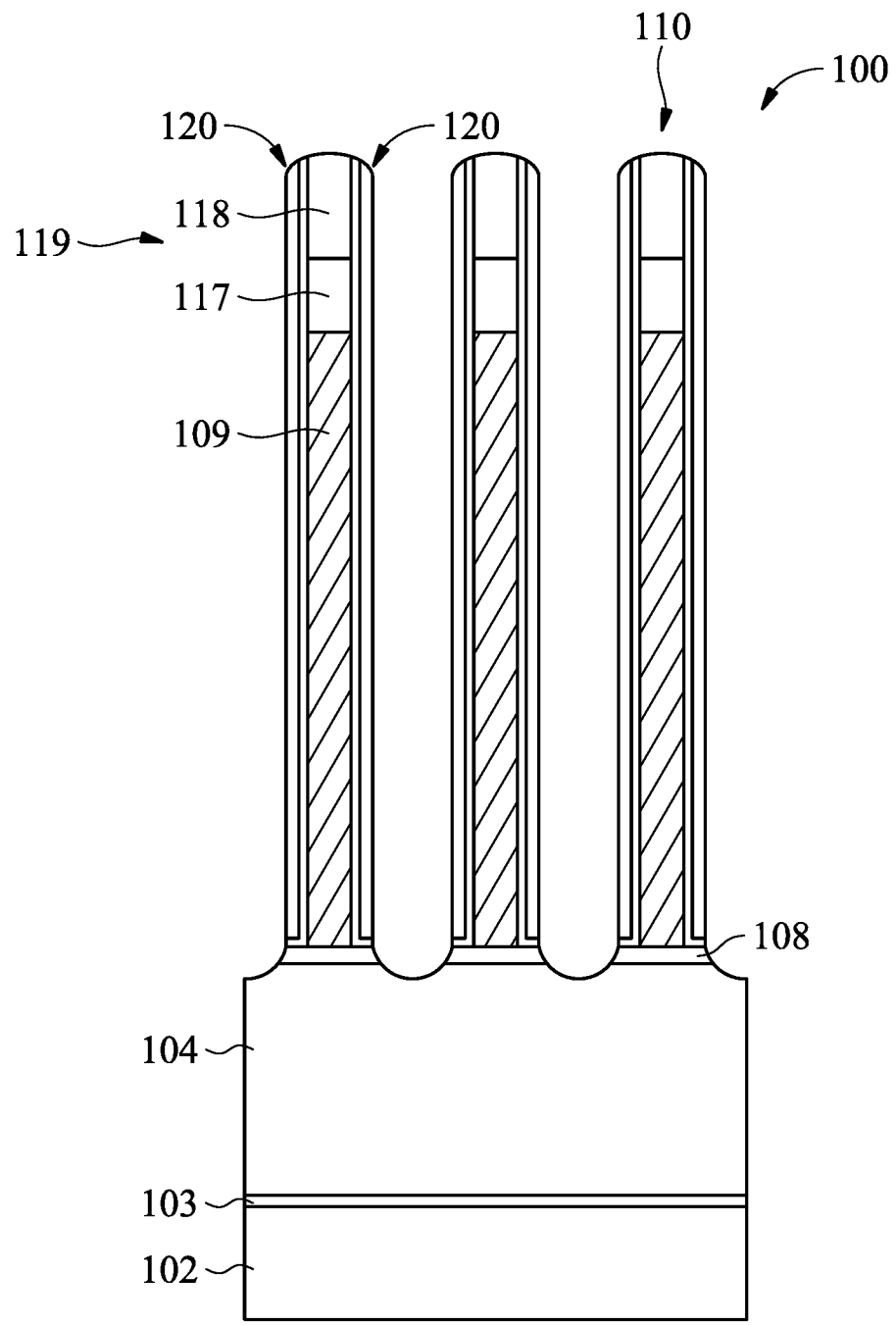

FIGS. 2B-1, 2B-2 and 2B-3 illustrate cross-sectional views of an intermediate structure at one stage of fabricating the semiconductor device 100 following FIGS. 2A-1, 2A-2 and 2A-3, which are taken along line I-I, line II-II and line III-III in FIG. 1, respectively, in accordance with some embodiments. The fin stack 114S is etched in an anisotropic etching process and using the gate spacers 120 and the dummy gate structure 110 as an etching mask to form recesses 126 at the source and drain regions 112 (FIG. 1), as shown in FIG. 2B-1 in accordance with some embodiments.

The anisotropic etching process may be a dry etching process that includes RIE, NBE, or another etching process. In addition, the recess 126 is also between the fin sidewall spacers 125, as shown in FIG. 2B-2 in accordance with some embodiments. In addition, the isolation structure 104 may be slightly recessed in the anisotropic etching process for forming the gate spacers 120, as shown in FIG. 2B-3 in accordance with some embodiments.

Figure 2C:
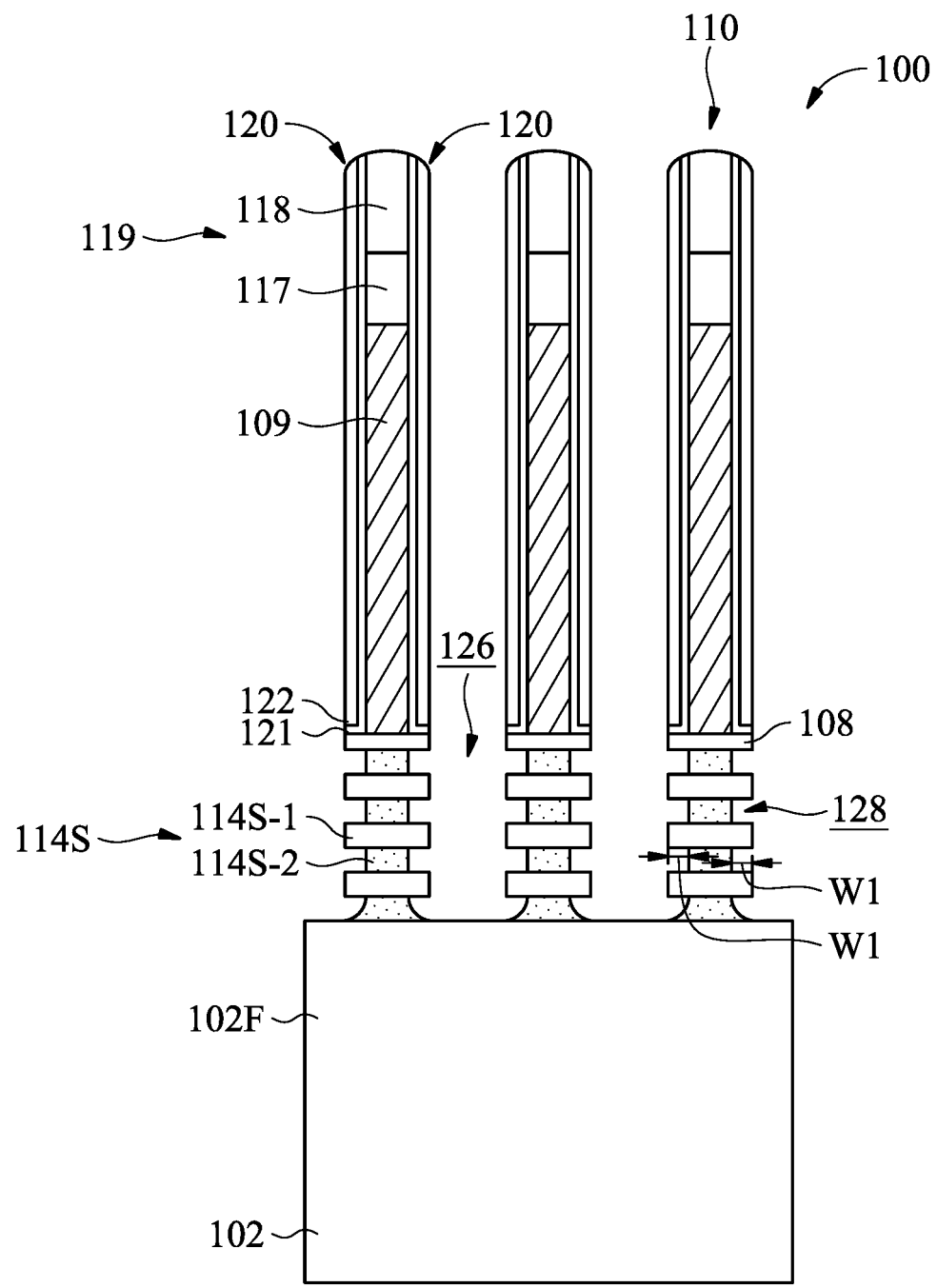

Next, according to the embodiments of the disclosure, some portions of the second semiconductor layers 114S-2 are removed using an isotropic etching process to form recesses 128, as shown in FIG. 2C in accordance with some embodiments. In some examples, the recesses 128 have a width W1 that is in a range from about 3 nm to about 8 nm. In the isotropic etching process, the second semiconductor layers 114S-2 have a higher etch selectivity than the first semiconductor layers 114S-1. The second semiconductor layers 114S-2 are etched to form recessed second semiconductor layers and the first semiconductor layers 114S-1 remain as channel layers.

In some embodiments, the isotropic etching process may be a dry etching process such as a plasma etching, RIE or another dry etching process. The etchant of the dry etching process may include a fluorocarbon-based gas such as carbon tetrafluoride ($CF_4$), trifluoromethane ($CHF_3$); a fluorine-based gas such as nitrogen trifluoride ($NF_3$), sulfur hexafluoride ($SF_6$), hydrogen fluoride (HF); a chlorine-based gas such as chlorine gas ($Cl_2$); and/or a bromine-based gas such as hydrogen bromide (HBr). Alternatively, the isotropic etching process may be a wet chemical etching process that uses an etching solution such as ammonium hydroxide-peroxide water mixture (APM), tetramethylammonium hydroxide (TMAH), ammonium hydroxide ($NH_4OH$), or another etchant.

Figure 2D:
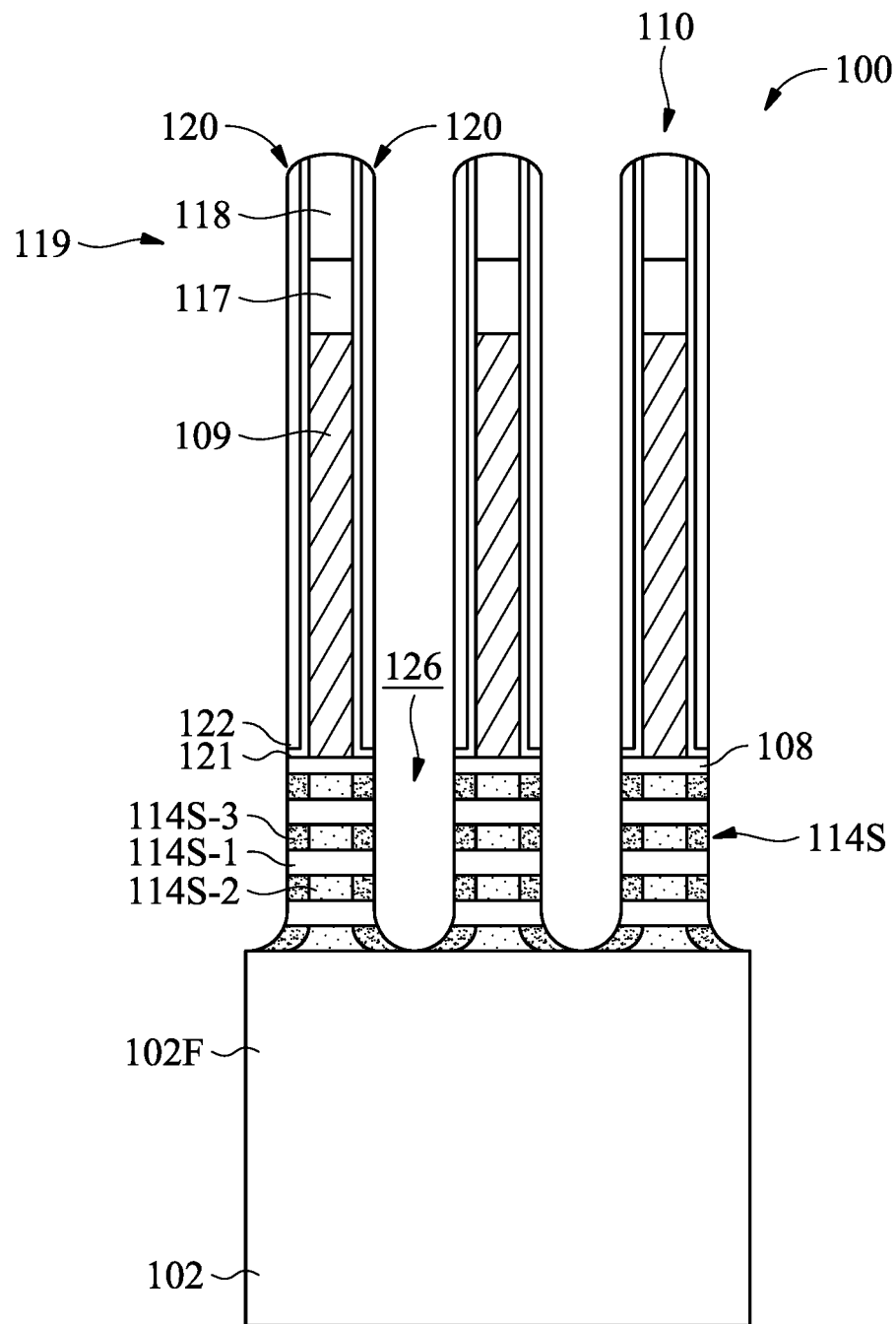

Afterwards, according to the embodiments of the disclosure, third semiconductor layers 114S-3 are formed on the sidewalls of the fin stack 114S to fill the recesses 128, as shown in FIG. 2D in accordance with some embodiments. The third semiconductor layers 114S-3 are formed with crystal orientation using epitaxial growth and etch-back processes. The etch-back process may be a wet chemical etching process using an etching solution such as ammonium hydroxide-peroxide water mixture (APM) or a dry etching process using an etching gas such as hydrochloric acid (HCl) gas. After the etch-back process, the sidewalk of the third semiconductor layers 114S-3 may be aligned with the sidewalls of the first semiconductor layers 114S-1. The third semiconductor layers 114S-3 are formed on the sidewalk of the recessed second semiconductor layers 114S-2. Moreover, the material of the third semiconductor layers 114S-3 is different from that of the second semiconductor layers 114S-2. The third semiconductor layers 114S-3 have a lower etch selectivity than the second semiconductor layers 114S-2.

In some embodiments, the third semiconductor layers 114S-3 includes silicon germanium ($Si_{1-y}Ge_y$), germanium (Ge) or silicon-germanium-carbon (SiGeC). The molar ratio y of Ge in the third semiconductor layers 114S-3 is higher than the molar ratio x of Ge in the second semiconductor layers 114S-2. In some examples, the molar ratio y of Ge in the third semiconductor layers 114S-3 is equal to or greater than about 0.4.

Figures 1, 2E:
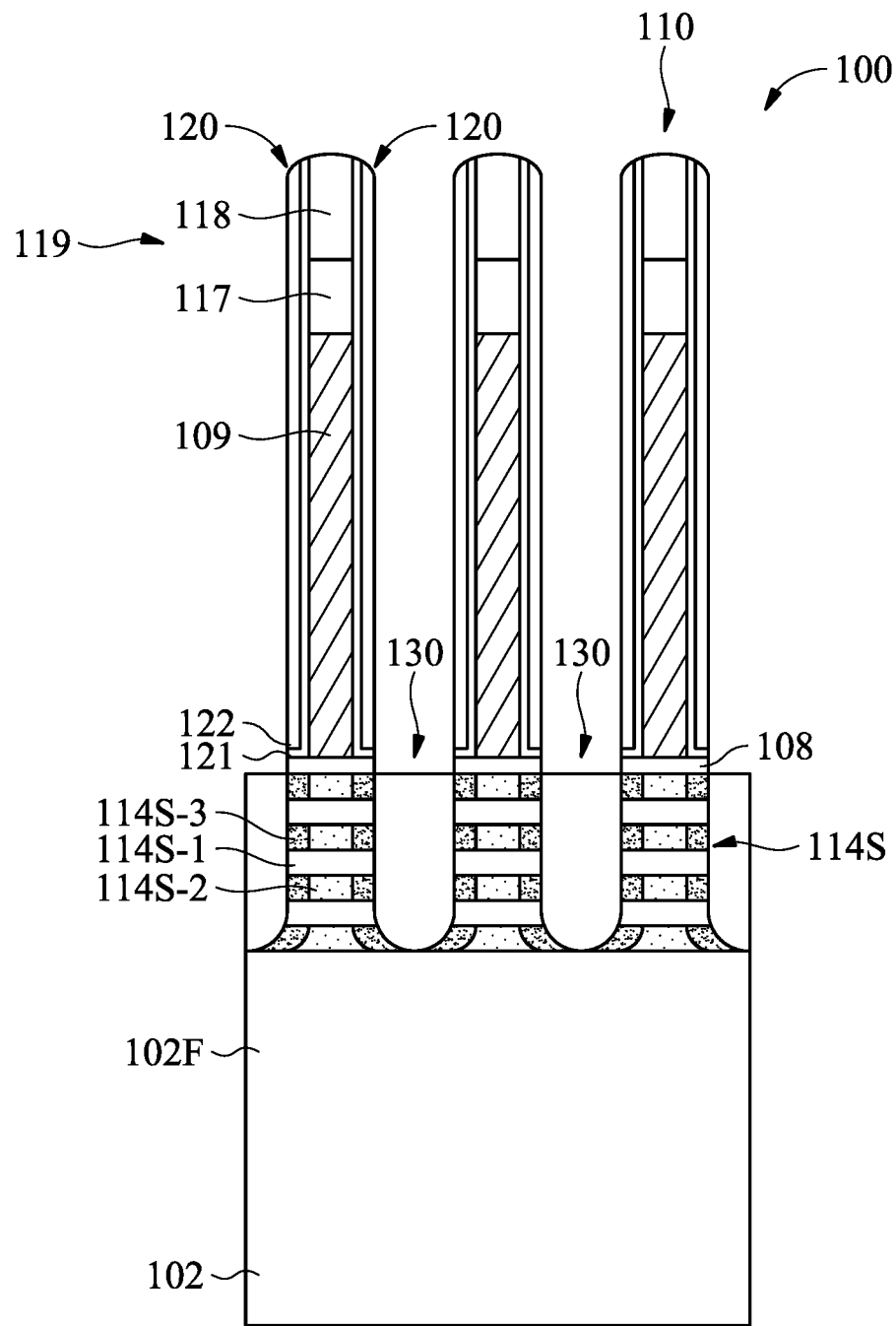
Figures 2, 2E:
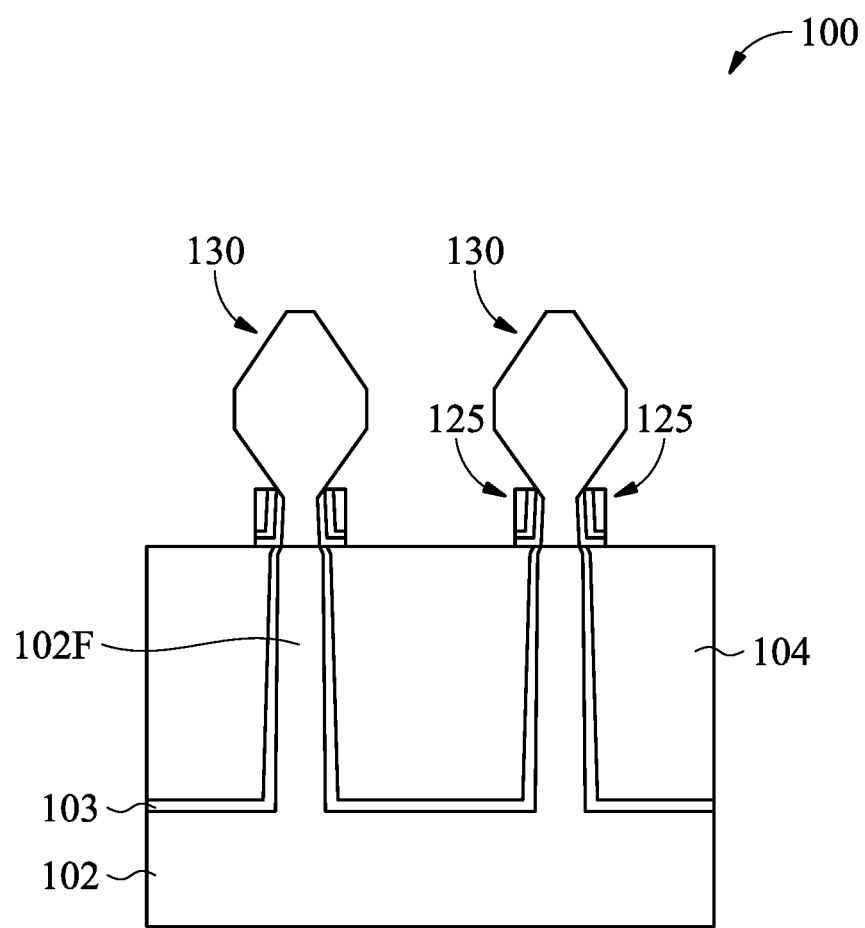

Next, epitaxial source and drain structures 130 are formed in the recesses 126, as shown in FIGS. 2E-1 and 2E-2, in accordance with some embodiments. The epitaxial source and drain structures 130 are epitaxilly grown on a continuous semiconductor surface that is constituted of the sidewalls of the third semiconductor layers 114S-3 and the first semiconductor layers 114S-1. According to the embodiments of the disclosure, the third semiconductor layers 114S-3 and the first semiconductor layers 114S-1 provide a continuous and uniform semiconductor surface with crystal orientation for epitaxially growing the epitaxial source and drain structures 130. Therefore, the epitaxial source and drain structures 130 are formed with reduced defects. The performance of the semiconductor devices is thereby improved.

Referring to FIG. 2E-2, the epitaxial source and drain structures 130 are also formed on the fin 102F and between the fin sidewall spacers 125 that are formed of the remaining portions 120' and 108' (FIG. 2B-2), in accordance with some embodiments. The top surface of the epitaxial source and drain structure 130 is higher than that of the fin sidewall spacers 125. In some other embodiments, the fin sidewall spacers 125 are omitted. Referring to FIG. 2E-1, the epitaxial source and drain structures 130 are on opposite sides of the dummy gate structure 110. In some instances, the top surfaces of the epitaxial source and drain structures 130 may be higher than or at the same level with the dummy gate dielectric layer 108 of the dummy gate structure 110.

Figures 1, 2F:
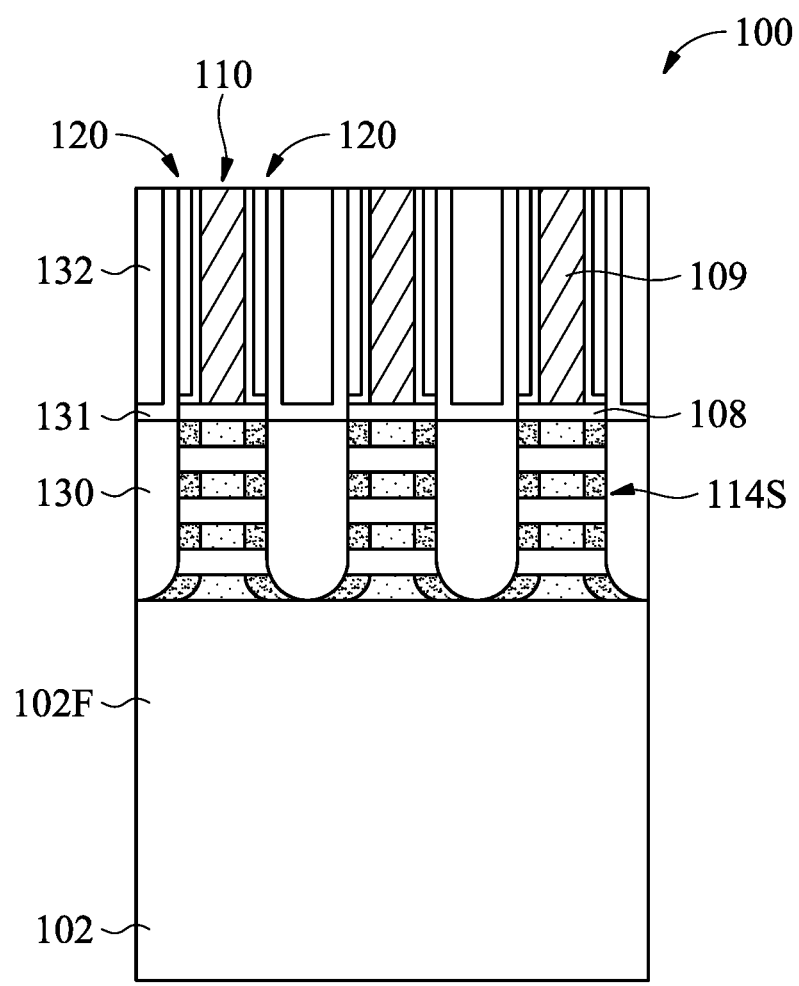
Figures 2, 2F:
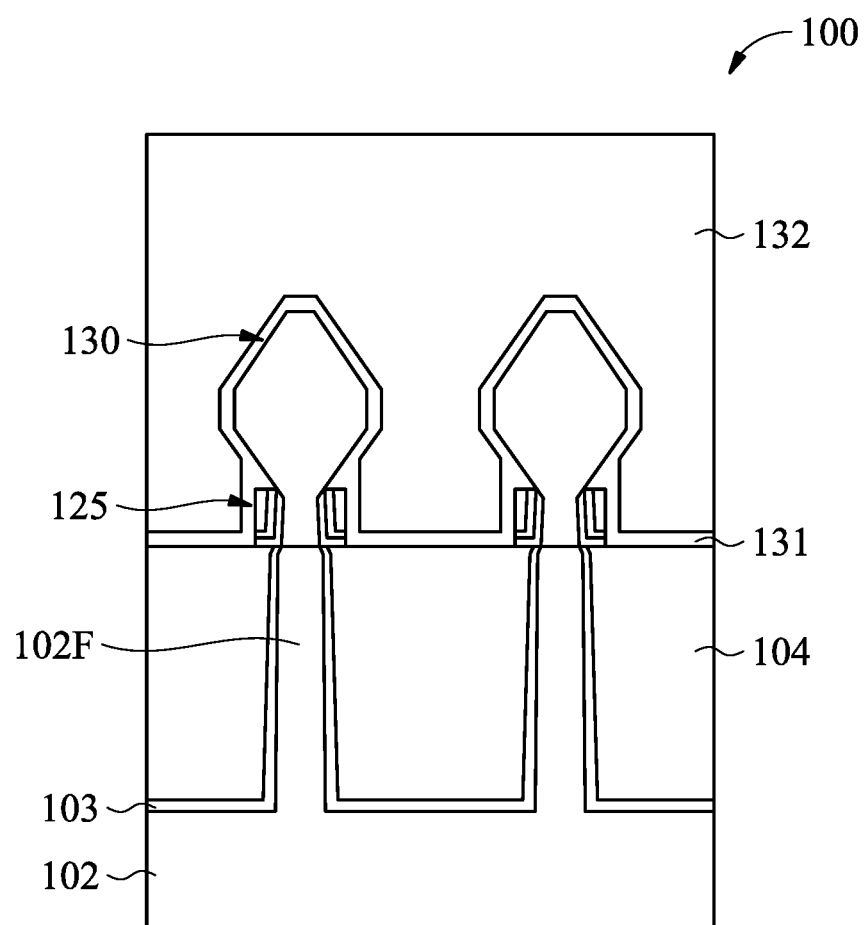

The epitaxial source and drain structures 130 may include silicon germanium ($Si_zGe_{1-z}$, where z can be between approximately 0 and 1), silicon carbide, silicon phosphorus, germanium, an III-V compound semiconductor, an II-VI compound semiconductor, or another epitaxial semiconductor. For example, the materials of an III-V compound semiconductor may include InAs, AlAs, GaAs, InP GaN, InGaAs, InAlAs, GaSb, AlSb, AlP or GaP. In some examples, each of the epitaxial source and drain structures 130 has multiple regions with different compositions in the epitaxial materials from each other. The epitaxial source and drain structures 130 may be formed by metal-organic CVD (MOCVD), molecular beam epitaxy (MBE), liquid phase epitaxy (LPE) vapor phase epitaxy (VPE), selective epitaxial growth (SEG), or a combination thereof. Each of the epitaxial source and drain structures 130 has several facets as shown in FIG. 2F-2. In addition, the epitaxial source and drain structures 130 may be doped by in-situ doping during the epitaxial growth and/or by implantation after the epitaxial growth. Hence, the source and drain regions 112 of FIG. 1 may be formed by epitaxial growth, and possibly with implantation, on opposite sides of the dummy gate structures 110.

Next, referring to FIGS. 2F-1 and 2F-2, a contact etch stop layer (CESL) 131 and an interlayer dielectric (ILD) layer 132 are formed on the epitaxial source and drain structures 130 and on the isolation structure 104, in accordance with some embodiments. The CESL 131 is conformally deposited along the sidewalls of the gate spacers 120 and on the top surfaces of the epitaxial source and drain structures 130, as shown in FIG. 2F-1 in accordance with some embodiments. The CESL 131 is also conformally deposited on the top surface and along the facets of the epitaxial source and drain structure 130, along the fin sidewall spacers 125, and on the top surface of the isolation structure 104, as shown in FIG. 2F-2 in accordance with some embodiments. The ILD layer 132 is deposited on the CESL 131 and around the gate spacers 120.

Generally, the CESL 131 can provide a mechanism to stop an etching process when forming via contacts to the epitaxial source and drain structures 130. The CESL 131 may be formed of a dielectric material having a different etch selectivity from the adjacent ILD layer 132. The material of the CESL 131 may include silicon nitride (SiN or $Si_3N_4$), silicon carbon nitride (SiCN) or a combination thereof, and may be deposited by CVD, PECVD, ALD, or another deposition process. In some examples, the CESL 131 has a thickness in a range from about 2 nm to about 5 nm. The material of the ILD layer 132 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 132 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 132 and the CESL 131. The first hard mask 117 and the second hard mask 118 over the dummy gate electrode layer 109 are also removed in the planarization process. After the planarization process, the dummy gate electrode layer 109 is exposed. The top surfaces of the ILD layer 132 and the CESL 131 are coplanar with the top surfaces of the dummy gate electrode layer 109 and the gate spacers 120.

Figure 2G:
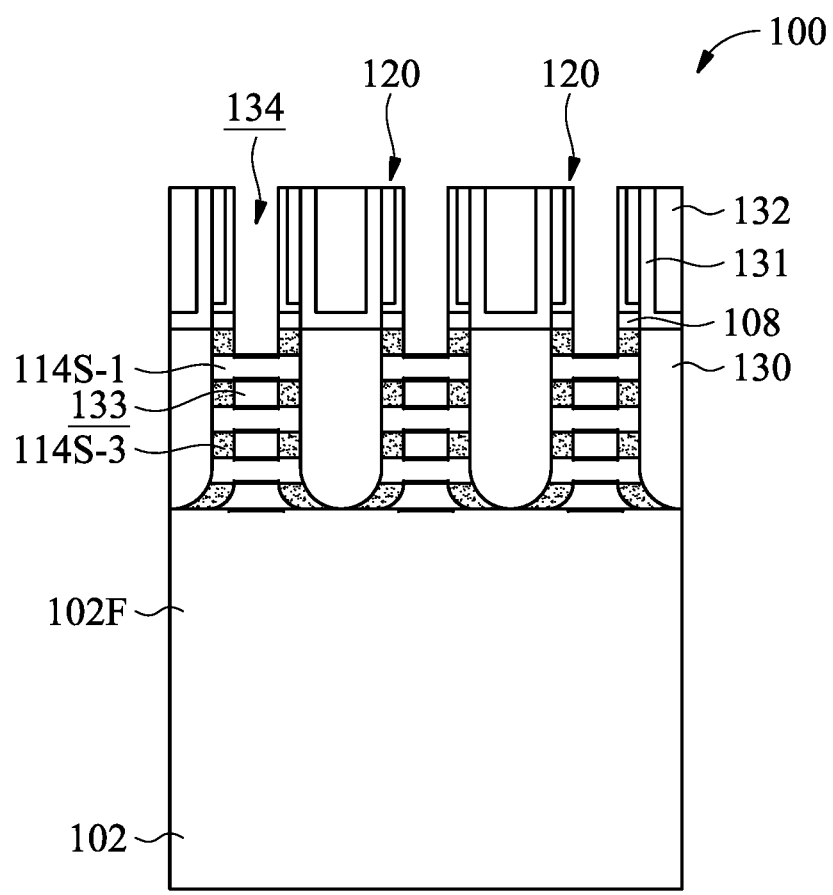

Referring to FIG. 2G, the dummy gate electrode layer 109, the dummy gate dielectric layer 108 and the second semiconductor layers 114S-2 (FIG. 2F-1) are removed in accordance with some embodiments. The dummy gate electrode layer 109 and a portion of the dummy gate dielectric layer 108 are removed in one or more etching processes to form trenches 134 between the gate spacers 120. Moreover, the second semiconductor layers 114S-2 are also removed in the etching process to form spaces 133 between the first semiconductor layers 114S-1. Each of the spaces 133 is also formed between the third semiconductor layers 114S-3. In the etching process, the second semiconductor layers 114S-2 have a higher etch selectivity than the third semiconductor layers 114S-3, the first semiconductor layers 114S-1 and the epitaxial source and drain structure 130. The third semiconductor layers 114S-3 can be used as an etch stop layer in the etching process for removing the second semiconductor layers 114S-2.

In some embodiments, the etching process may be a dry etching process, such as a remote plasma etching process that may use a gas mixture of HF-based gas, $N_2$ and $NH_3$ to generate radicals by remote plasma source (RPS) or a chemical dry etching process without plasma source. Alternatively, the etching process may be a wet etching process using a chemical etchant that has a high selectivity to the dummy gate electrode layer 109, the dummy gate dielectric layer 108 and the second semiconductor layers 114S-2 while compared with the third semiconductor layers 114S-3, the first semiconductor layers 114S-1 and the epitaxial source and drain structure 130. The chemical etchant is for example hydrofluoric acid (HF) or ammonia ($NH_4OH$). In some instances, portions of the dummy gate dielectric layer 108 may be remained directly under the gate spacers 120.

Figure 2H:
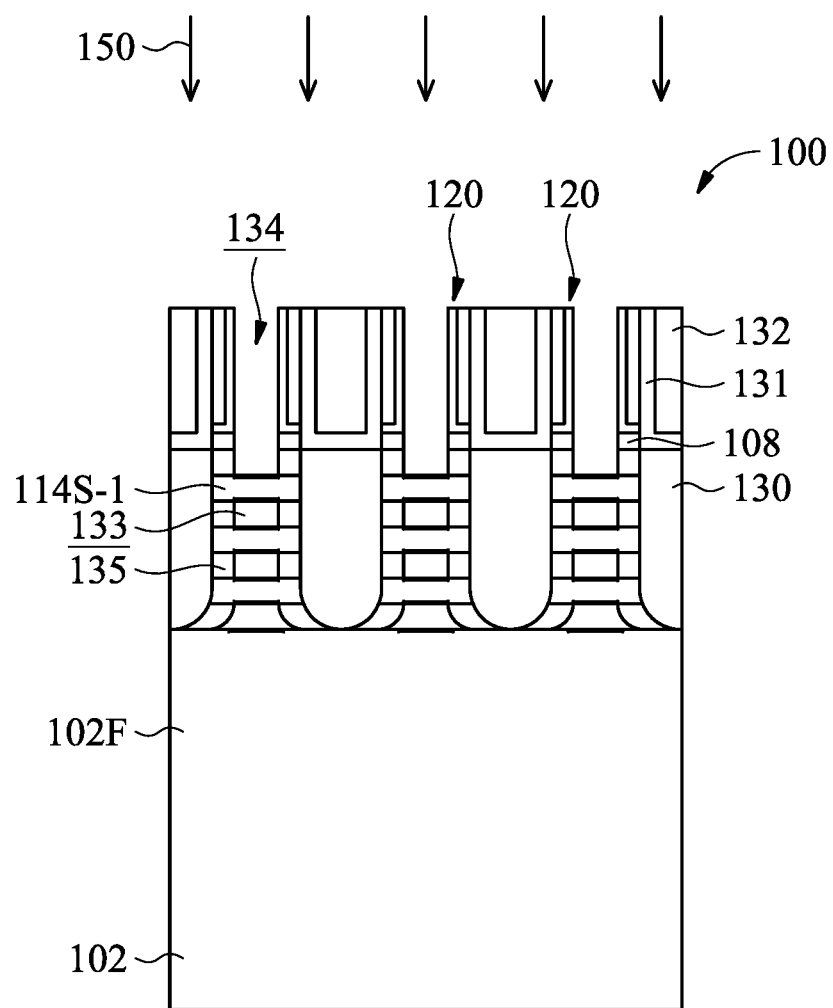

Afterwards, an oxidation process 150 is performed on the third semiconductor layers 114S-3 to form inner spacers 135, as shown in FIG. 2H in accordance with some embodiments. The third semiconductor layers 114S-3 are oxidized to form the inner spacers 135 through the oxidation process 150. In some embodiments, the third semiconductor layers 114S-3 are made of silicon germanium, germanium (Ge) or silicon-germanium-carbon (SiGeC). As a result of the oxidation, the inner spacers 135 are made of an oxide of silicon germanium, germanium (Ge) or silicon-germanium-carbon (SiGeC) of the third semiconductor layers 114S-3, such as SiGeO, GeO or SiGeCO. In some examples, the inner spacers 135 have a dielectric constant (k value) that is in a range from about 3.5 to about 7.0. The inner spacers 135 with low k can reduce capacitance and gain performance of the semiconductor devices. In some embodiments, the oxidation process 150 is an anneal process performed with oxygen gas. The oxidation process 150 may be performed at the temperature in a range from about 300° C. to about 600° C., for the duration in a range from about 20 minutes to about 2 hours.

Figure 2I:
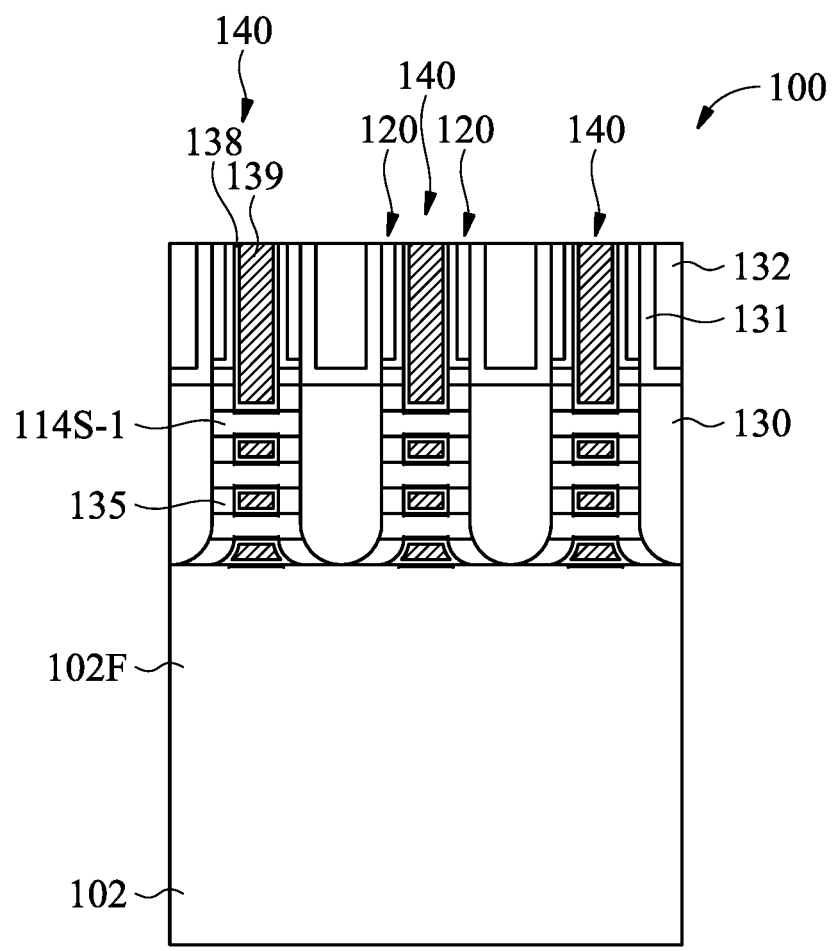

Next, referring to FIG. 2I, replacement gate structures 140 are formed in the spaces 133 and the trenches 134 of FIG. 2H, in accordance with some embodiments. The replacement gate structure 140 includes a gate dielectric layer 138 and a gate electrode layer 139. The gate dielectric layer 138 may be a high-k gate dielectric layer, and the gate electrode layer 139 may be a metal gate electrode layer. The gate dielectric layer 138 is conformity deposited on the inner sidewalk of the gate spacers 120 and the inner spacers 135, to surround the first semiconductor layers 114S-1, and on the top surface of the fin 102F that is exposed through the spaces 133 (FIG. 2H). The gate electrode layer 139 is formed on the gate dielectric layer 138 to fill the trench 134 and the spaces 133. Moreover, the gate electrode layer 139 is also formed to surround the first semiconductor layers 114S-1 to form a GAA structure. The inner spacers 135 are disposed on opposite sides of the replacement gate structure 140 and between the epitaxial source and drain structures 130 and the replacement gate structure 140.

The gate dielectric layer 138 includes silicon oxide, silicon nitride, a high-k dielectric material, multilayers thereof, or other dielectric material. The high-k dielectric material may have a k-value greater than about 7.0. The high-k dielectric material may include a metal oxide of or a metal silicate of Hf, Al, Zr, La, Mg, Ba, Ti, Pb, Ta or a combination thereof. The gate dielectric layer 138 may be deposited by ALD, PECVD, molecular-beam deposition (MBD), or another deposition process. In some examples, the gate dielectric layer 138 has a thickness in a range from about 15 Å to about 25 Å.

The gate electrode layer 139 is formed over the gate dielectric layer 138. In some embodiments, the gate electrode layer 139 includes multiple layers, such as a capping layer, a barrier layer, a work-function tuning layer and a metal fill material. The capping layer, the barrier layer and the work-function tuning layer are conformally deposited over the gate dielectric layer 138 in sequence.

The capping layer may include titanium nitride, titanium-silicon nitride, titanium-carbon nitride, titanium-aluminum nitride, tantalum nitride, tantalum-silicon nitride, tantalum-carbon nitride, aluminum nitride, or a combination thereof, and may be deposited by ALD, PECVD, MBD, or another deposition process. In some examples, the capping layer may have a thickness in a range from about 5 Å to about 25 Å.

The barrier layer may include tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof, and may be deposited by ALD, PECVD, MBD, or another deposition process. In some examples, the barrier layer may have a thickness in a range from about 5 Å to about 25 Å.

The work-function tuning layer may include titanium aluminum carbide (TiAlC), a titanium aluminum alloy (TiAl), tantalum-aluminum carbide, or a combination thereof, and may be deposited by ALD, PECVD, MBD, or another deposition process. In some examples, the work-function tuning layer may have a thickness in a range from about 10 Å to about 60 Å. Other examples may have various other configurations of work-function tuning layers to achieve a desired performance of the FinFET to be formed. For example, any different number of work-function layers having various materials and/or thicknesses may be used. In some instances, for example, a p-type FinFET and an n-type FinFET may have different work-function tuning layers.

The metal fill material is deposited to fill the remaining space over the work-function tuning layer. The metal fill material may include tungsten, cobalt, ruthenium, aluminum, copper, multi-layers thereof, or a combination thereof. The metal fill material may be deposited by ALD, PECVD, MBD, PVD, or another deposition process.

Moreover, excess portions of the gate dielectric layer 138 and the gate electrode layer 139 deposited on the top surfaces of the ILD layer 132, the CESL 131 and the gate spacers 120 may be removed in a planarization process, such as a CMP process. The result of the planarization process is illustrated as the structures of FIG. 2I in accordance with some embodiments. The top surface of the replacement gate structure 140 may be coplanar with the top surfaces of the ILD layer 132, the CESL 131 and the gate spacers 120. Referring to FIG. 2I, the replacement gate structure 140 is formed to surround the first semiconductor layers 114S-1 that are used as channel layers. As a result, the semiconductor device 100 having a GAA structure with the inner spacer 135 after the formation of the epitaxial source and drain structures 130 are fabricated.

Afterwards, via contacts (not shown) to the epitaxial source and drain structures 130 are formed in the ILD layer 132. The via contacts are formed to pass through the CESL layer 131 and to be in contact with the epitaxial source and drain structures 130. The via contacts are formed by forming contact holes in the ILD layer 132 and the CESL layer 131 using photolithography and etching processes. The epitaxial source and drain structures 130 are exposed through the contact holes.

Thereafter, the contact holes are filled with a conductive material using a depositing process. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include titanium, titanium nitride, tantalum, tantalum nitride, or the like. The liner may be deposited by ALD, PECVD, MBD, PVD, or another deposition technique. In addition, an anneal process may be performed to facilitate a reaction between some portions of the liner and the epitaxial source and drain structures 130 to form silicide regions at the respective epitaxial source and drain structures 130.

The conductive material of the via contacts includes a metal, such as cobalt, tungsten, copper, aluminum, gold, silver, alloys thereof, or a combination thereof, and may be deposited by CVD, ALD, PVD, or another deposition technique. Next, excess portion of the conductive material over the ILD layer 132 is removed in a planarization process, such as a CMP process, to form the via contacts.

Afterwards, an additional ILD layer (not shown) is formed on the ILD layer 132 and the gate structure 140. A contact to the gate structure 140 is formed in and passes through the additional ILD layer. The materials and the processes for forming the contact to the gate structure 140 may be the same as or similar to those described above with respect to the via contacts to the epitaxial source and drain structures 130.

According to the embodiments of the disclosure, methods for fabricating the semiconductor devices 100 such as FinFET devices having a GAA structure with inner spacer last process are provided. In some embodiments, portions of the second semiconductor layers 114S-2 are removed using an isotropic etching process to form the recesses 128 in the fin stack 114S. Next, the third semiconductor layers 114S-3 are formed in the recesses 128 using epitaxial growth and etch-back processes. The sidewalk of the third semiconductor layers 114S-3 and the first semiconductor layers 114S-1 provide a continuous semiconductor surface for epitaxially growing the epitaxial source and drain structures 130. Therefore, the defects in the epitaxial source and drain structures 130 produced during the epitaxial growth process are reduced or prevented. Afterwards, the recessed second semiconductor layers 114S-2 are removed to form the spaces 133 between the first semiconductor layers 114S-1. The third semiconductor layers 114S-3 are then oxidized to form the inner spacers 135. Next, the replacement gate structure 140 is formed to fill the spaces 133 and to surround the first semiconductor layers 114S-1 to be a GAA structure.

In the embodiments of the disclosure, the defects in the epitaxial source and drain structures 130 are reduced and the performance of the semiconductor devices is thereby improved. Moreover, the inner spacers 135 are formed after the formation of the epitaxial source and drain structures 130. Therefore, the etching, cleaning and epitaxial growth processes for forming the epitaxial source and drain structures 130 do not damage the inner spacers 135. The yield of fabrication of the semiconductor devices is enhanced due to the inner spacers 135 without loss.

Figure 3A:
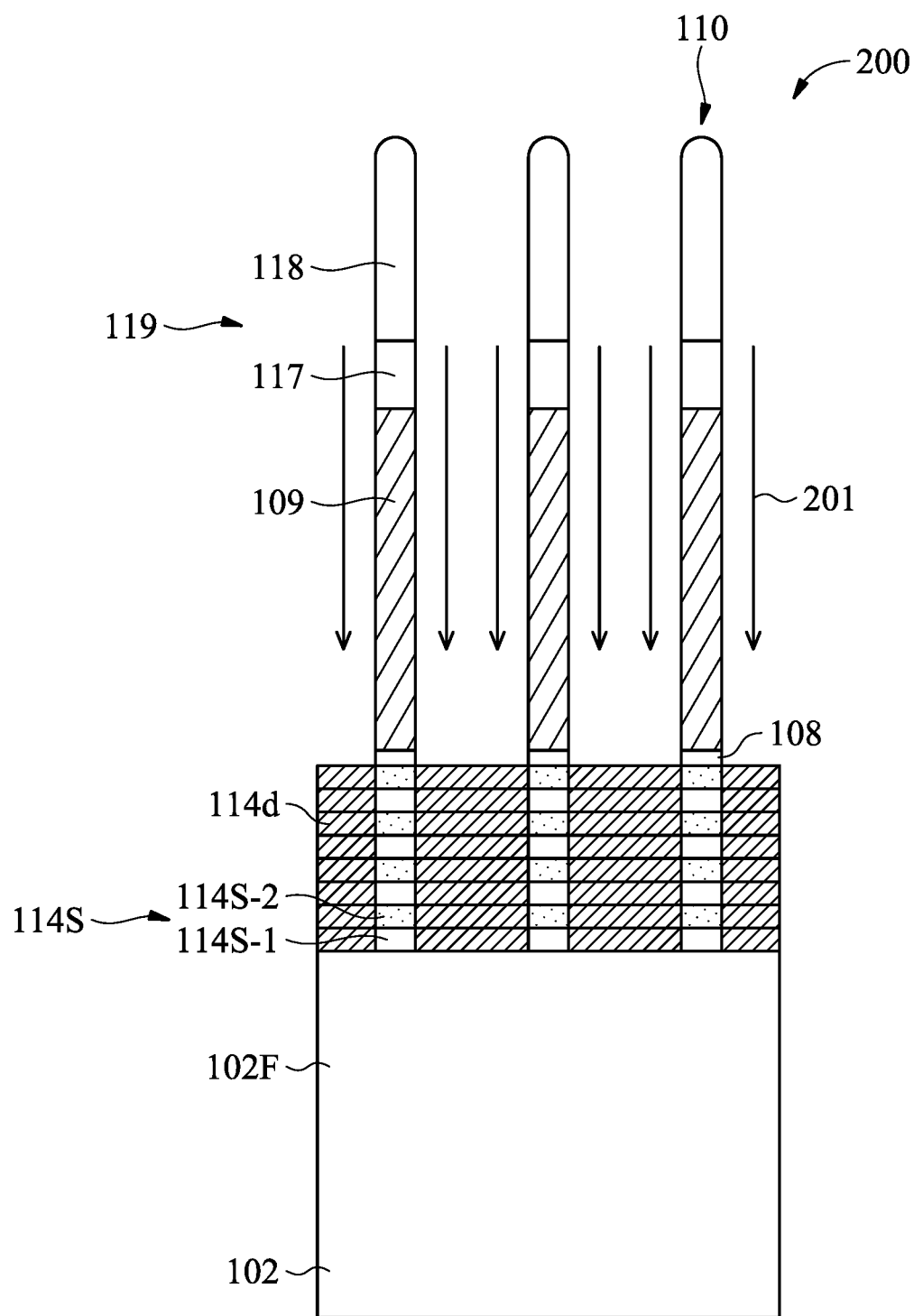

FIGS. 3A, 3B-1, 3B-2, 3C-1, 3C-2, 3D-1, 3D-2 3E, 3F and 3G illustrate cross-sectional views of respective intermediate structure at various stage an exemplary method for fabricating a semiconductor device 200 taken along line I-I or line II-II in FIG. 1, in accordance with some embodiments. Referring to FIG. 3A, the dummy gate electrode layer 109 and the dummy gate dielectric layer 108 are patterned together and formed on the fin stack 114S using the first hard mask 117 and the second hard mask 118 as an etching mask in an etching process, in accordance with some embodiments. The materials and processes for forming the dummy gate electrode layer 109, the dummy gate dielectric layer 108, the first hard mask 117 and the second hard mask 118 may be the same as or similar to those described with respect to FIG. 2A-1. The dummy gate electrode layer 109, the dummy gate dielectric layer 108, the first hard mask 117 and the second hard mask 118 are together referred to as a dummy gate structure 110.

Next, an ion implantation process 201 is performed on the fin stack 114S using the dummy gate structure 110 as a mask to form doped portions 114d in the fin stack 114S. The first semiconductor layers 114S-1 and the second semiconductor layers 114S-2 of the fin stack 114S are doped with a dopant in the ion implantation process 201. In some embodiments, the dopant includes carbon (C), germanium (Ge) or another suitable dopant. The dopant Ge will alter the oxidation rate later in inner spacer formation. In some examples, the doped concentration of the dopant Ge in the fin stack 114S is less than about 10 atom %. In the ion implantation process 201, the fin stack 114S is implanted with the dopant at a tilt angle of about 0 degree. The tilt angle is an angle between the implantation direction and the direction normal to the surface of the semiconductor substrate 102. The implantation direction of the ion implantation process 201 is substantially normal to the top surface of the fin stack 114S, and the regions of the fin stack 114S exposed through the dummy gate structure 110 are implanted with the dopant. In some examples, a doped concentration of the dopant in the fin stack 114S is in a range from about 1 atom % to about 2 atom %.

Afterwards, a first spacer layer 121 and a second spacer layer 122 are conformally deposited on the second hard mask 118, along the sidewalk of the second hard mask 118, the first hard mask 117, the dummy gate electrode layer 109 and the dummy gate dielectric layer 108. The first spacer layer 121 is in direct contact with the top surface of the doped portions 114d of the fin stack 114S. The materials and processes for forming the first spacer layer 121 and the second spacer layer 122 may be the same as or similar to those described with respect to FIG. 2A-1. The first spacer layer 121 and the second spacer layer 122 are also conformally deposited on the doped portions 114d of the fin stacks 114S and on the isolation structure 104. The first spacer layer 121 is in direct contact with the doped portions 114d and the isolation structure 104.

Figures 1, 3B:
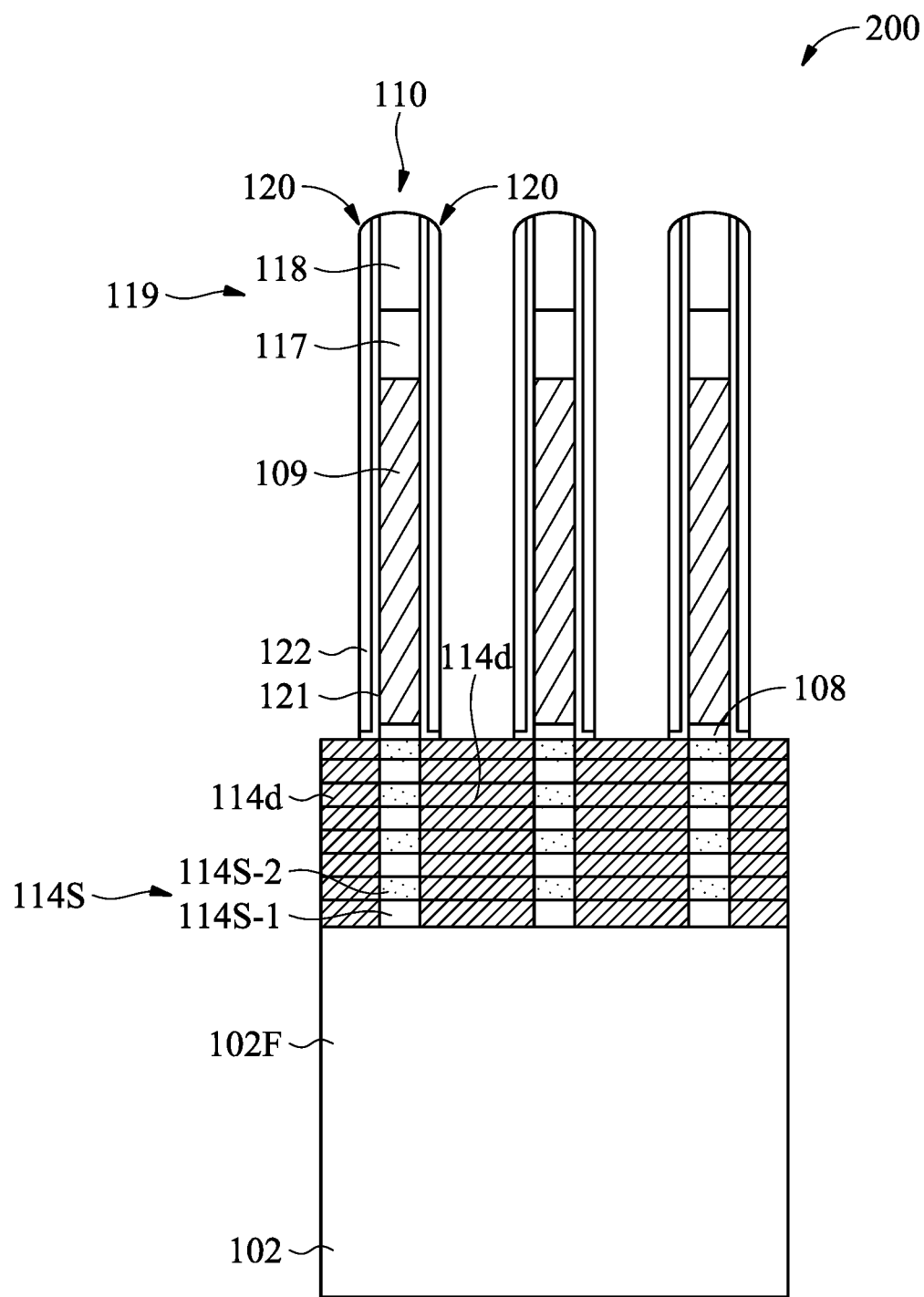
Figures 2, 3B:
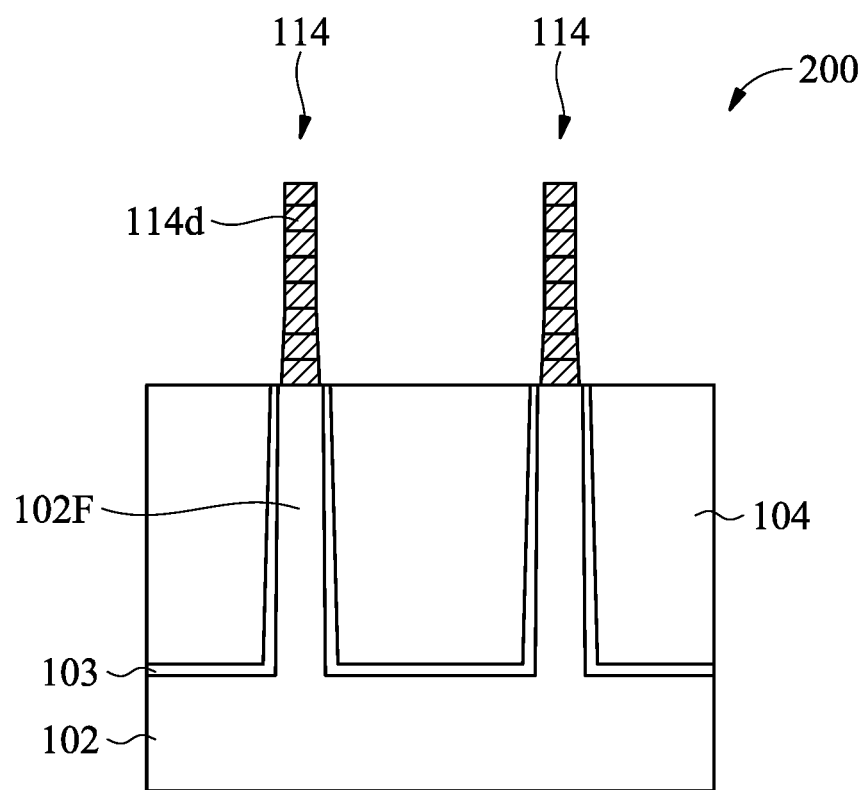

Next, the first spacer layer 121 and the second spacer layer 122 are patterned using an anisotropic etching process to form gate spacers 120 on the sidewalls of the dummy gate structure 110, as shown in FIG. 3B-1 in accordance with some embodiments. The first spacer layer 121 and the second spacer layer 122 on the doped portions 114d and on the isolation structure 104 may be removed and no fin sidewall spacer remains, as shown in FIG. 3B-2 in accordance with some embodiments.

Figures 1, 3C:
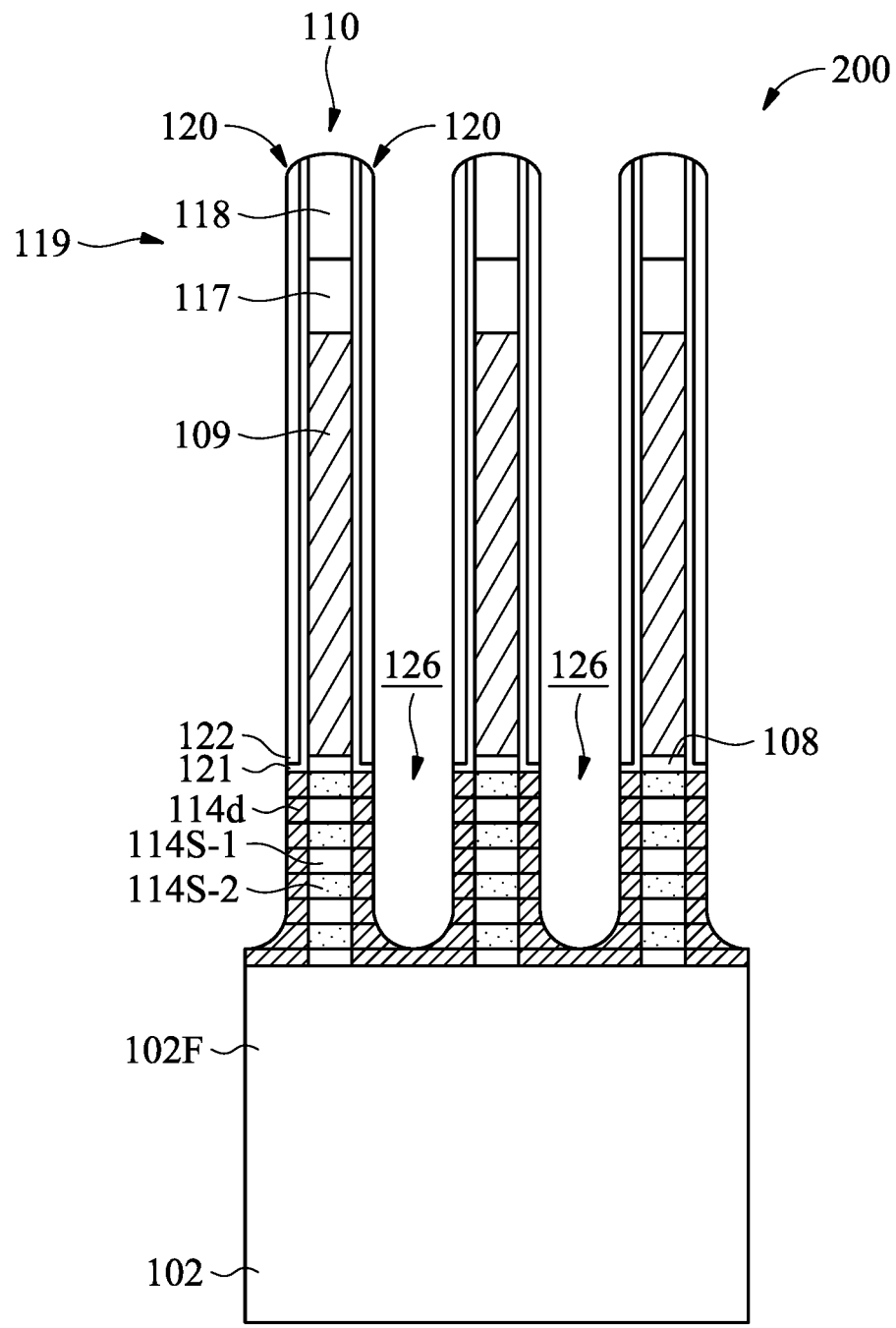
Figures 2, 3C:
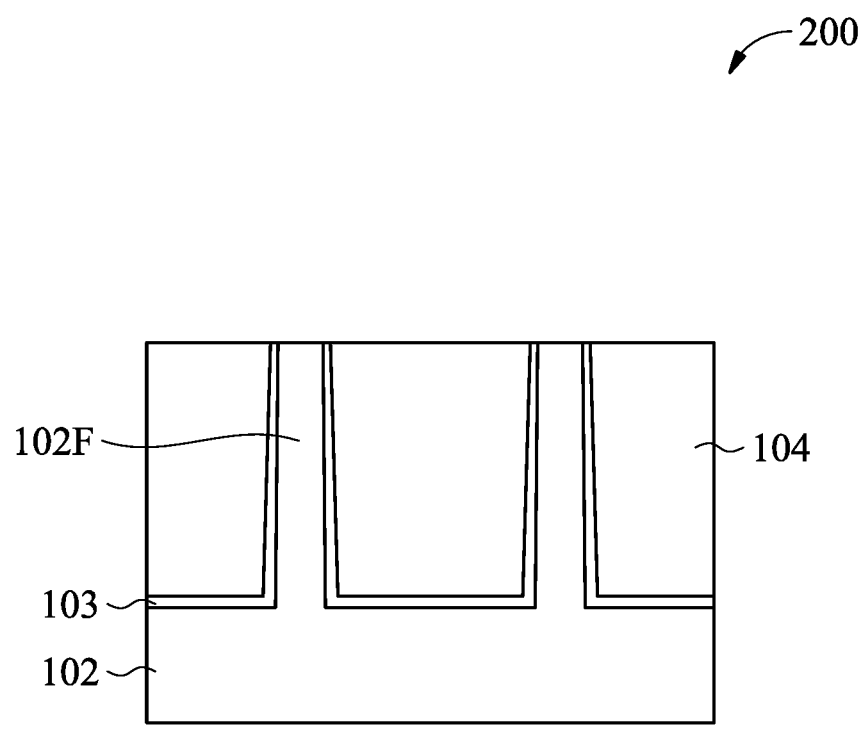

Afterwards, the doped portions 114d of the fin stacks 114S are etched using the dummy gate structure 110 and the gate spacers 120 as an etching mask to form recesses 126 at the source and drain regions, as shown in FIGS. 3C-1 and 3C-2 in accordance with some embodiments. After the recesses 126 are formed, the remaining parts of the doped portions 114d are directly under the gate spacers 120 and in a lightly doped drain (LDD) region. Moreover, the remaining parts of the doped portions 114d remain on the sidewalls of the first semiconductor layers 114S-1 and the second semiconductor layers 114S-2. The dopant is in the doped portions 114d of the first semiconductor layers 114S-1 and the doped portions 114d of the second semiconductor layers 114S-2 along the recesses 126.

Figures 1, 3D:
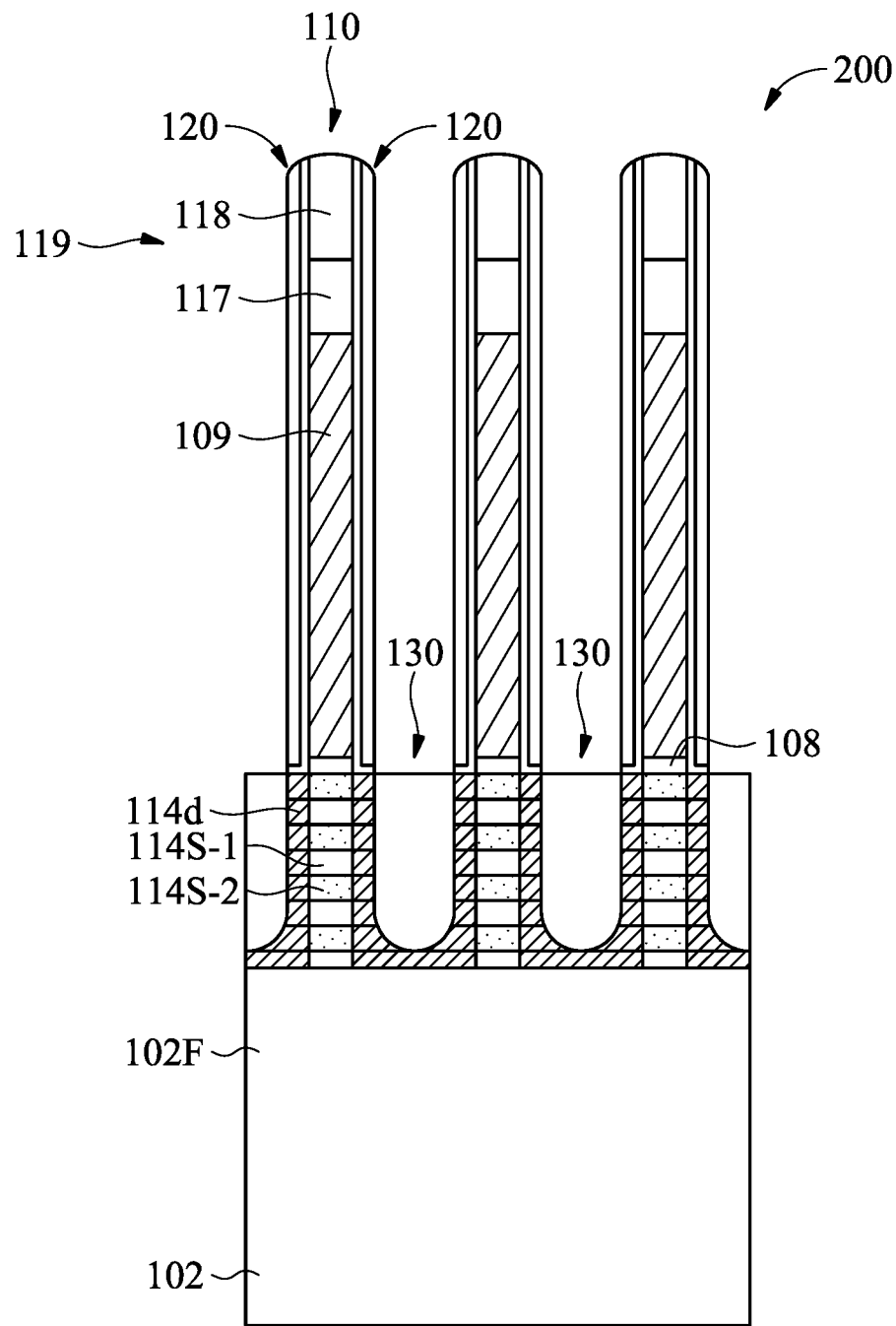
Figures 2, 3D:
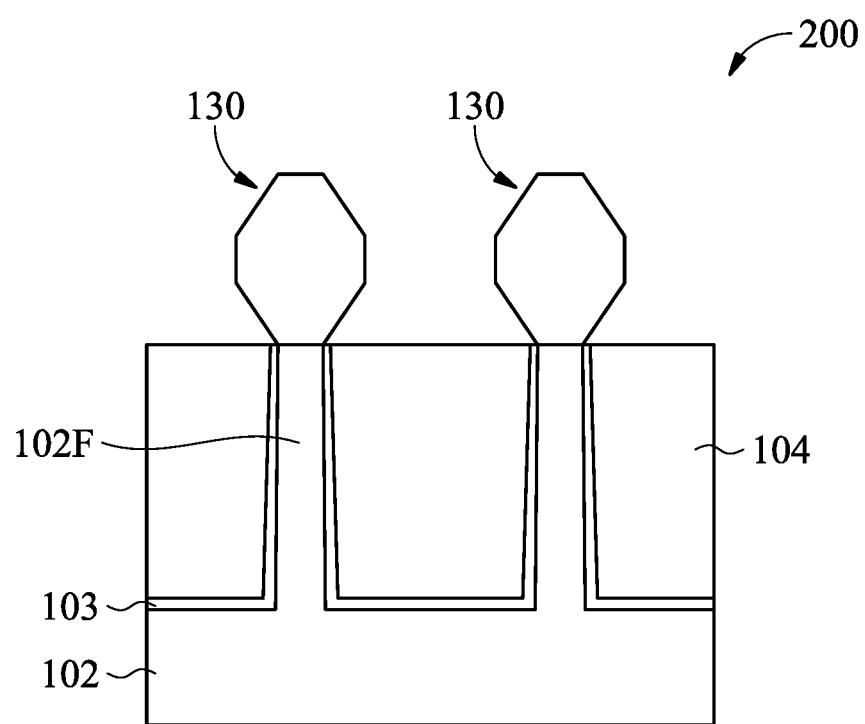

Referring to FIGS. 3D-1 and 3D-2, epitaxial source and drain structures 130 are formed in the recesses 126 and on the fins 102F in accordance with some embodiments. According to the embodiments of the disclosure, the doped portions 114d on the sidewalk of the first semiconductor layers 114S-1 and the second semiconductor layers 114S-2 provide a continuous semiconductor surface for epitaxially growing the epitaxial source and drain structures 130 to reduce defects during the epitaxial growth process.

Figure 3E:
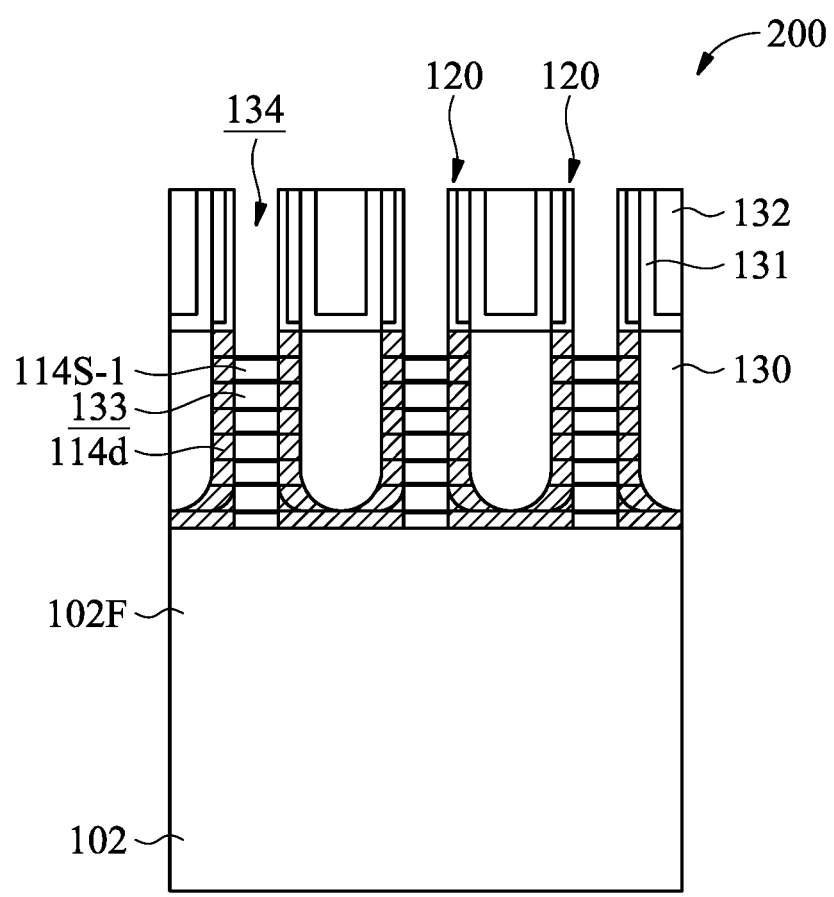

Next, a CESL 131 and an ILD layer 132 are deposited on the epitaxial source and drain structures 130 and to fill the spaces between the dummy gate structures 110. A planarization process, for example a CMP process is then performed on the ILD layer 132. After the CMP process, the second hard mask 118 and the first hard mask 117 are removed and the dummy gate electrode layer 109 is exposed. Afterwards, the dummy gate electrode layer 109, the dummy gate dielectric layer 108 and undoped portions of the second semiconductor layers 114S-2 are removed using one or more etching processes to form trenches 134 between the gate spacers 120 and to form spaces 133 between the first semiconductor layers 114S-1, as shown in FIG. 3E in accordance with some embodiments. In the etching process, the doped portions 114d have an etch selectivity that is lower than the second semiconductor layers 114S-2. Therefore, the doped portions 114d remain on the sidewalls of the epitaxial source and drain structures 130.

Figure 3F:
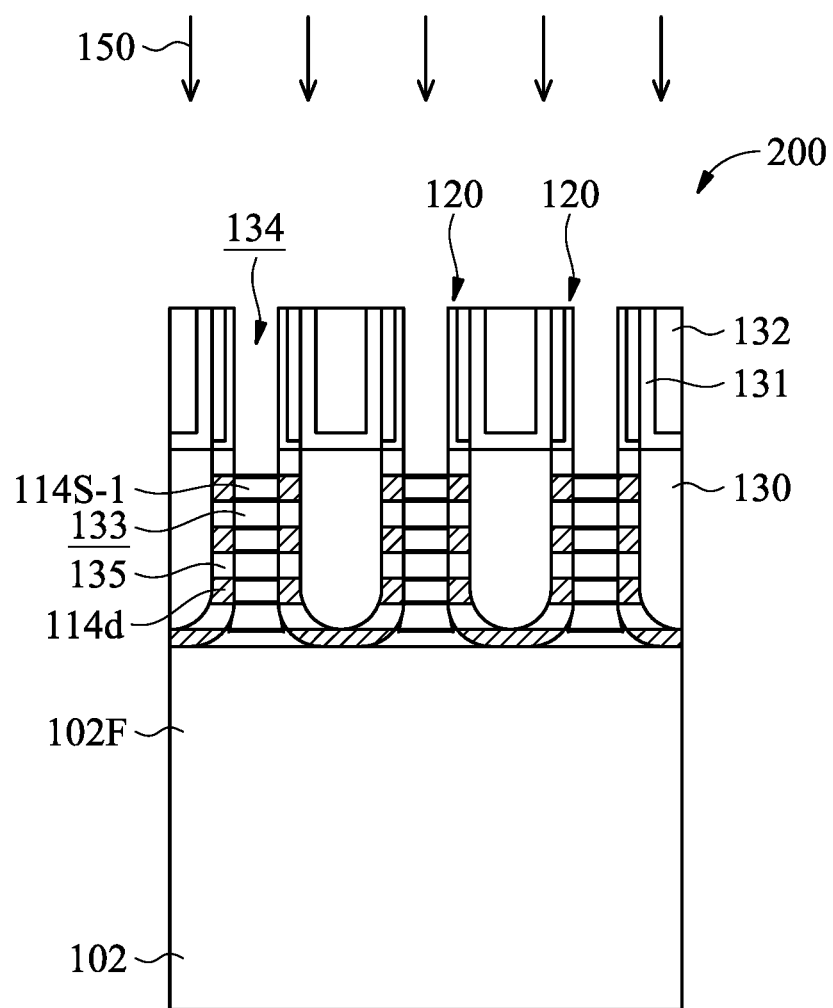

Afterwards, the doped portions 114d on opposite sides of the spaces 133 are oxidized to form inner spacers 135 by an oxidation process 150, as shown in FIG. 3F in accordance with some embodiments. The process conditions of the oxidation process 150 may be the same as or similar to those described with respect to FIG. 2H. In some instances, the doped portions 114d on opposite sides of the first semiconductor layers 114S-1 are not oxidized. The other portions of the doped portions 114d originally formed from the second semiconductor layers 114S-2 will be oxidized due to germanium (Ge) included in these portions.

Figure 3G:
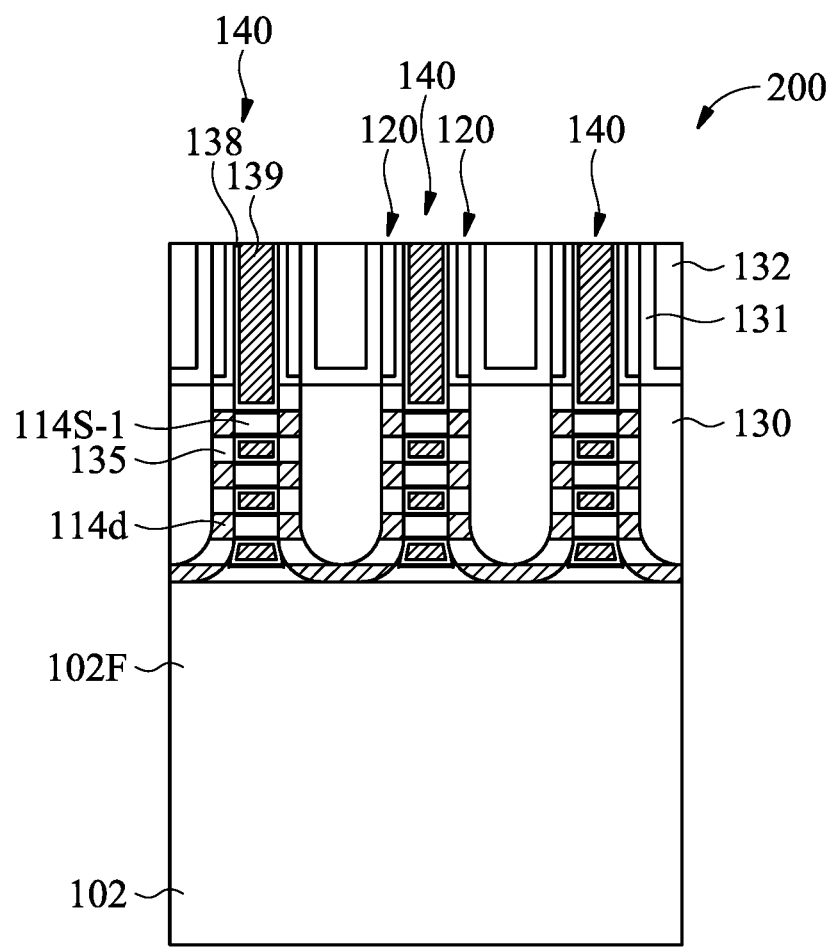

Next, replacement gate structures 140 are formed in the trenches 134 and the spaces 133 (FIG. 3F) and to surround the first semiconductor layers 114S-1 to be a GAA structure, as shown in FIG. 3G in accordance with some embodiments. The replacement gate structure 140 includes a gate dielectric layer 138 and a gate electrode layer 139. The materials and processes of forming the gate dielectric layer 138 and the gate electrode layer 139 may be the same as or similar to those described with respect to FIG. 2I. The inner spacers 135 are disposed between the epitaxial source and drain structures 130 and the replacement gate structure 140. The inner spacers 135 are formed after the formation of the epitaxial source and drain structures 130. Therefore, the inner spacers 135 are not damaged by the etching and cleaning processes of forming the recesses 126 for the epitaxial source and drain structures 130.

Figure 4A:
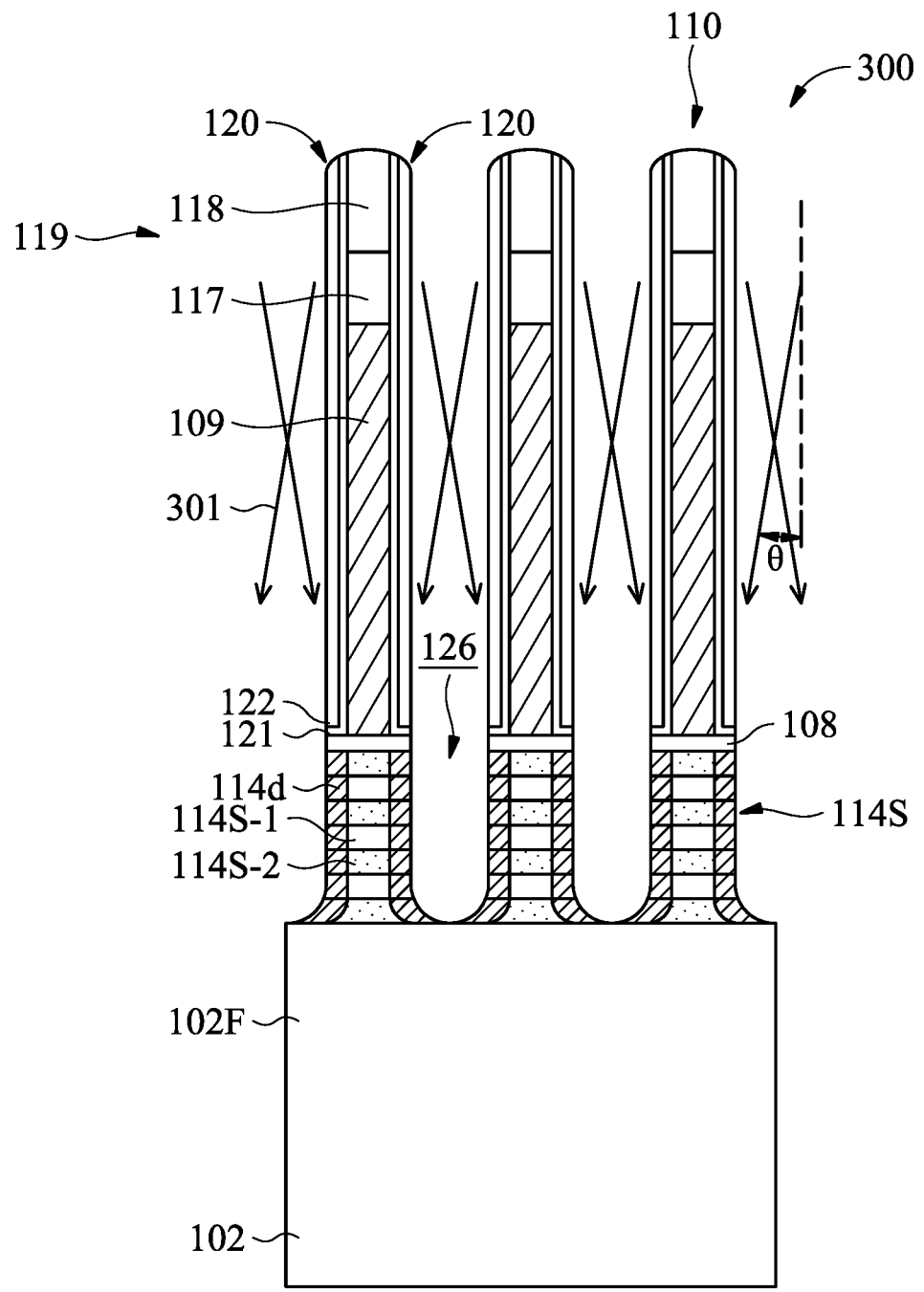
FIGS. 4A, 4B, 4C, 4D and 4E show cross-sectional views of respective intermediate structures at various stages of an exemplary method for fabricating a semiconductor device taken along line I-I in FIG. 1, in accordance with some embodiments.

FIGS. 4A, 4B, 4C, 4D and 4E illustrate cross-sectional views of respective intermediate structure at various stages of an exemplary method for fabricating a semiconductor device 300 taken along line I-I in FIG. 1, in accordance with some embodiments. Referring to FIG. 4A, a dummy gate structure 110 is formed on fin stack 114S, and gate spacers 120 are formed on the sidewalls of the dummy gate structure 110 in accordance with some embodiments. The dummy gate structure 110 includes a dummy gate dielectric layer 108, a dummy gate electrode layer 109, a first hard mask 117 and a second hard mask 118. The fin stack 114S includes multiple first semiconductor layers 114S-1 and multiple second semiconductor layers 114S-2 those are stacked alternately. Next, the fin stack 114S is etched using the dummy gate structure 110 and the gate spacers 120 as an etching mask to form recesses 126 at source and drain regions, as shown in FIG. 4A in accordance with some embodiments. The materials and processes for forming the above mentioned features may be the same as or similar to those described with respect to FIG. 2B-1.

Next, an ion implantation process 301 is performed on the sidewall portions of the fin stack 114S through the recesses 126 to form doped portions 114d, as shown in FIG. 4A in accordance with some embodiments. In the ion implantation process 301, the sidewall portions of the fin stack 114S are implanted with a dopant at a tilt angle $\theta$ of greater than 0 degrees. The dopant is in doped portions 114d of the first semiconductor layers 114S-1 and doped portions 114d of the second semiconductor layers 114S-2 along the recesses 126. In some examples, the tilt angle $\theta$ is in a range from about 5 degrees to about 20 degrees. The sidewall portions of the first semiconductor layers 114S-1 and the second semiconductor layers 114S-2 directly under the gate spacers 120 and in LDD regions may be doped with the dopant in the ion implantation process 301. In some embodiments, the dopant includes carbon (C), germanium (Ge) or another suitable dopant. In some examples, a doped concentration of the dopant in the doped portions 114d is in a range from about 1 atom % to about 2 atom %.

Figure 4B:
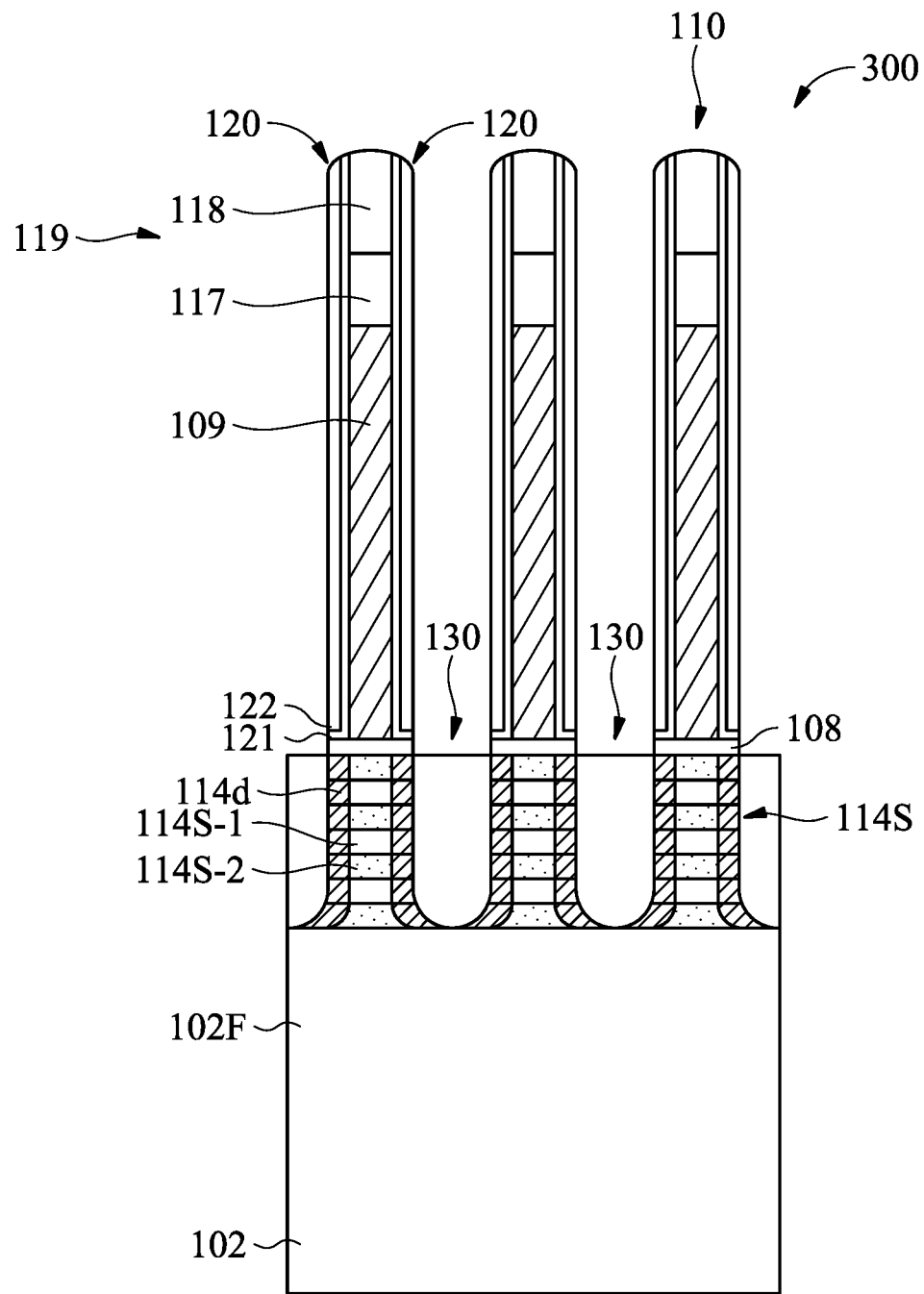

Referring to FIG. 4B, epitaxial source and drain structures 130 are formed in the recesses 126, in accordance with some embodiments. The doped portions 114d at the sidewalls of the fin stack 114S provide a continuous semiconductor surface for epitaxially growing the epitaxial source and drain structures 130 and to avoid defects produced during the epitaxial growth process.

Figure 4C:
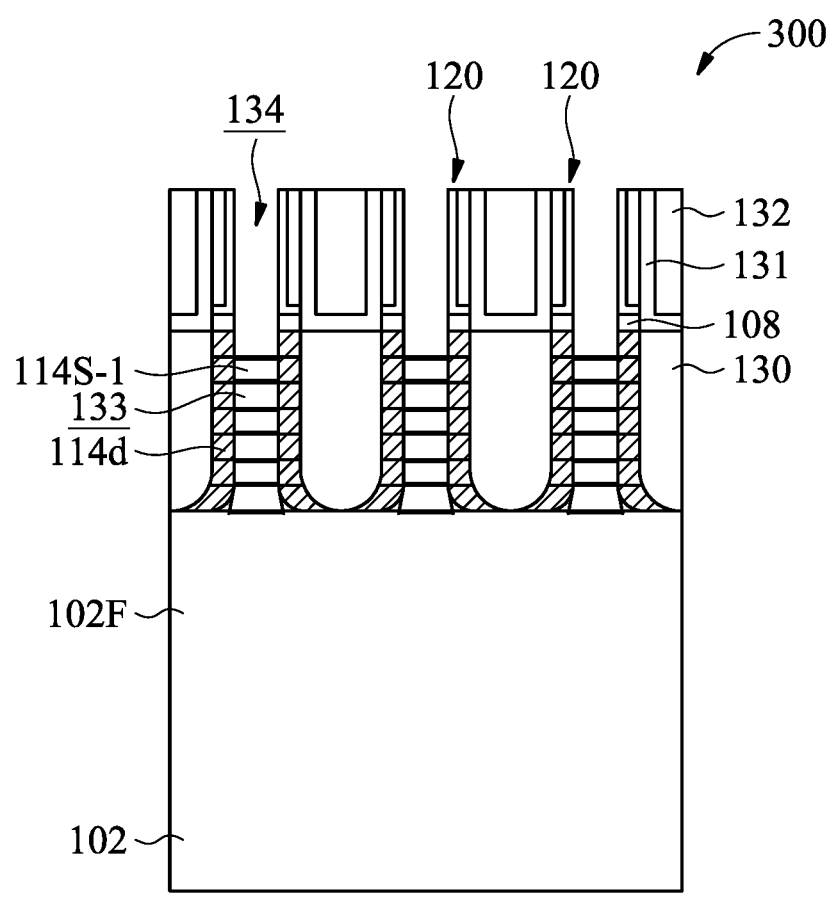

Next, a CESL 131 and an ILD layer 132 are deposited on the epitaxial source and drain structures 130 and to fill the spaces between the dummy gate structures 110. A planarization process, for example a CMP process is then performed on the ILD layer 132 and to remove the second hard mask 118 and the first hard mask 117. The dummy gate electrode layer 109 is exposed after the CMP process. Afterwards, the dummy gate electrode layer 109, the dummy gate dielectric layer 108 and undoped portions of the second semiconductor layers 114S-2 are removed using one or more etching processes to form trenches 134 between the gate spacers 120 and to form spaces 133 between the first semiconductor layers 114S-1, as shown in FIG. 4C in accordance with some embodiments. In the etching process, the doped portions 114d have an etch selectivity that is lower than the second semiconductor layers 114S-2. Therefore, the doped portions 114d remain on the sidewalls of the epitaxial source and drain structures 130.

Figure 4D:
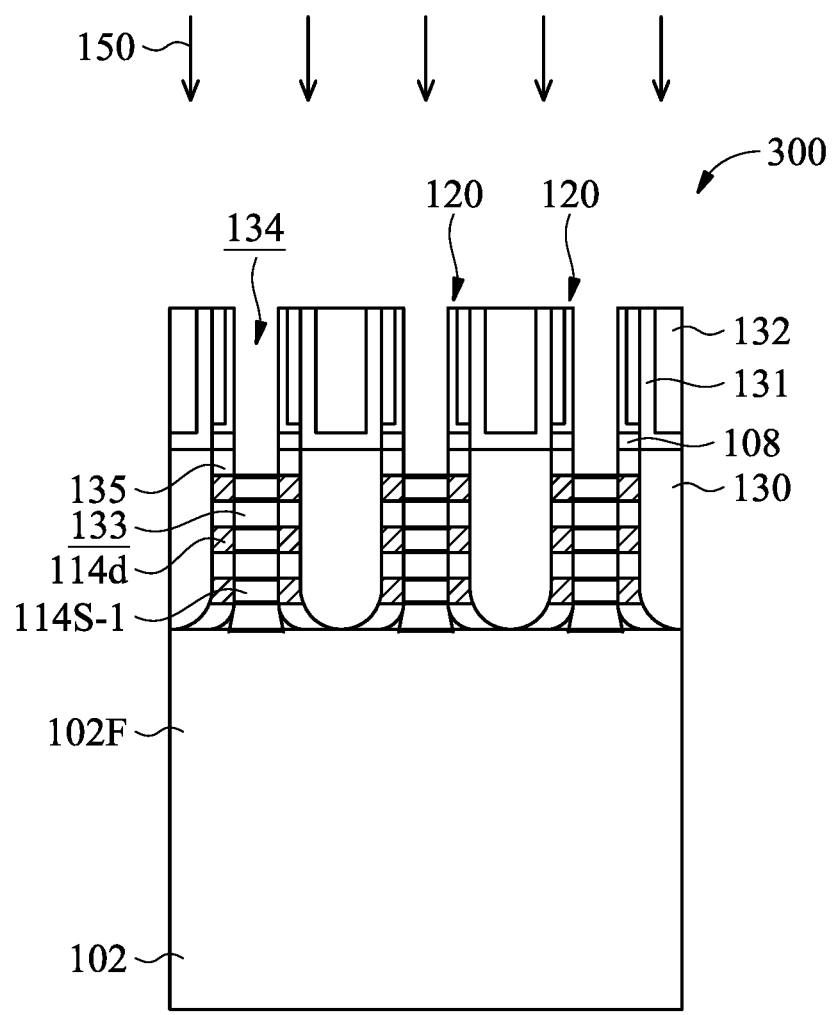

Afterwards, the doped portions 114d on opposite sides of the spaces 133 are oxidized to form inner spacers 135 by an oxidation process 150, as shown in FIG. 4D in accordance with some embodiments. The process conditions of the oxidation process 150 may be the same as or similar to those described with respect to FIG. 2H. In some instances, the doped portions 114d on opposite sides of the first semiconductor layers 114S-1 may be not oxidized.

Figure 4E:
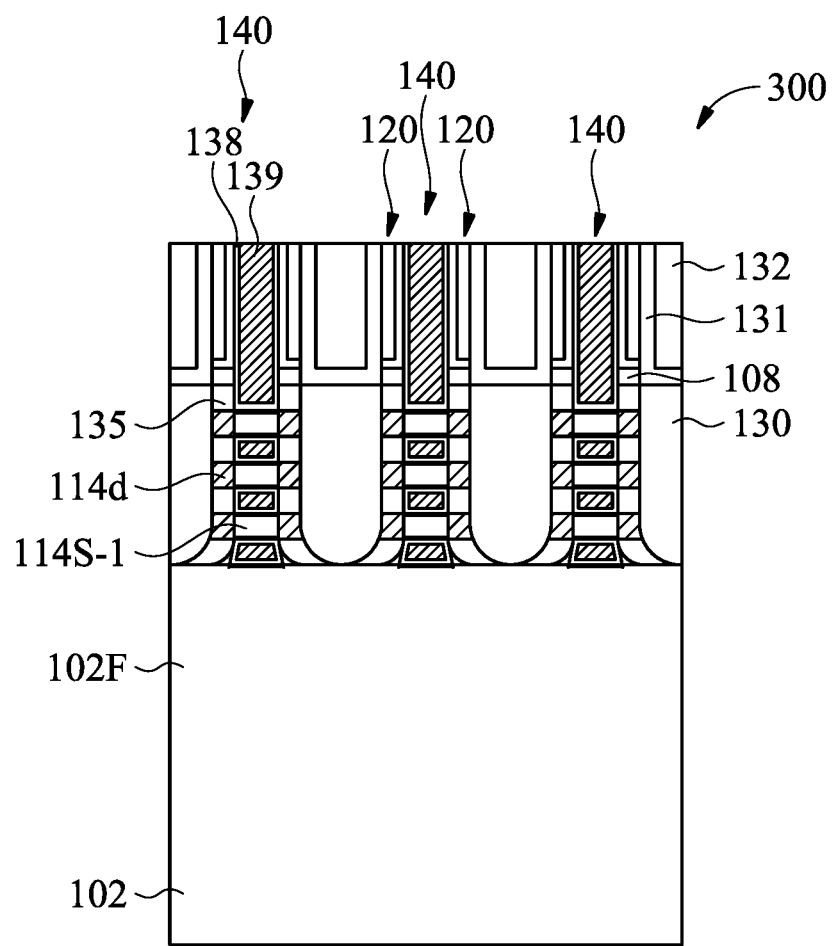

Next, replacement gate structures 140 are formed to fill the trenches 134 and the spaces 133 (FIG. 4D), as shown in FIG. 4E in accordance with some embodiments. The replacement gate structure 140 also surrounds the first semiconductor layers 114S-1 to be a GAA structure. The replacement gate structure 140 includes a gate dielectric layer 138 and a gate electrode layer 139. The materials and processes of forming the replacement gate structure 140 may be the same as or similar to those described with respect to FIG. 2I. The inner spacers 135 are disposed between the replacement gate structure 140 and the epitaxial source and drain structures 130. The inner spacers 135 are formed after the formation of the epitaxial source and drain structures 130. Therefore, the inner spacers 135 are not damaged by the etching and cleaning processes of forming the recesses 126 for the epitaxial source and drain structures 130.

Figure 5A:
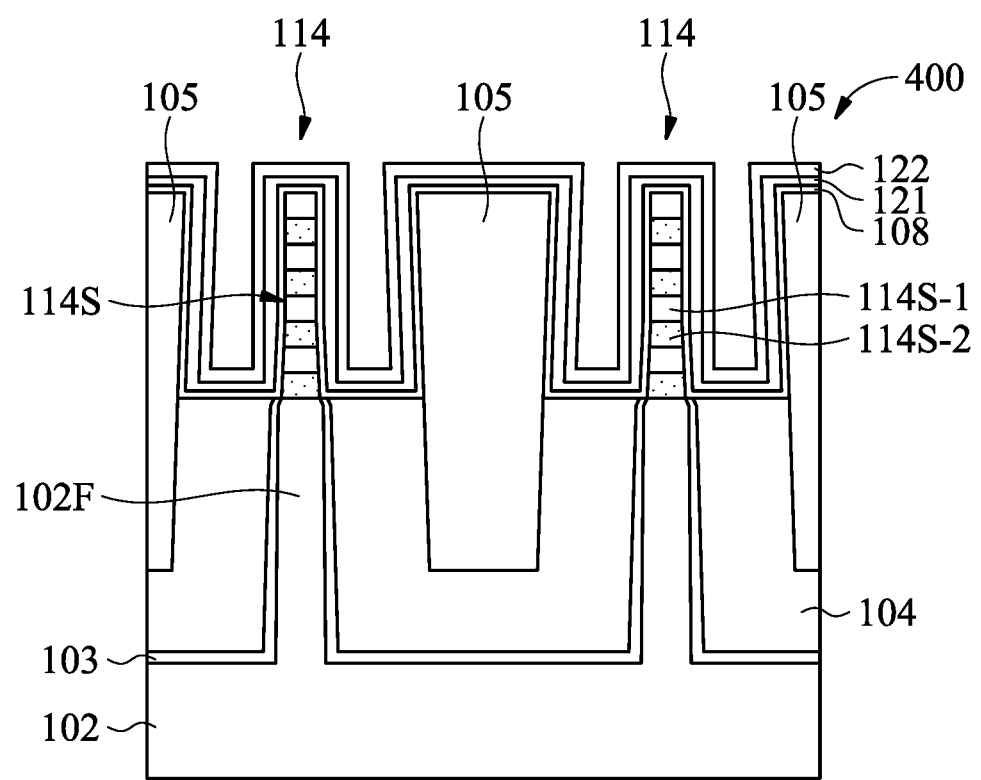
FIGS. 5A, 5B, 5C and 5D show cross-sectional views of respective intermediate structures at several stages of an exemplary method for fabricating a semiconductor device taken along line II-II in FIG. 1, in accordance with some embodiments.
Figure 5B:
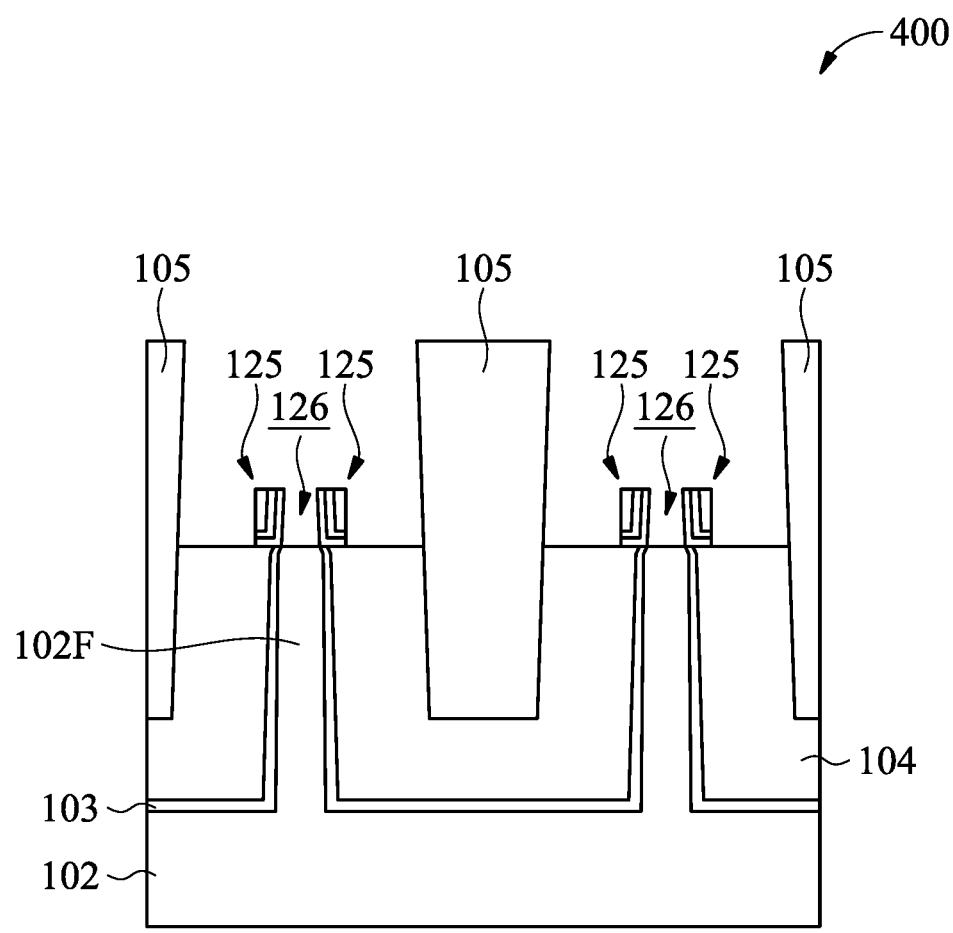
Figure 5C:
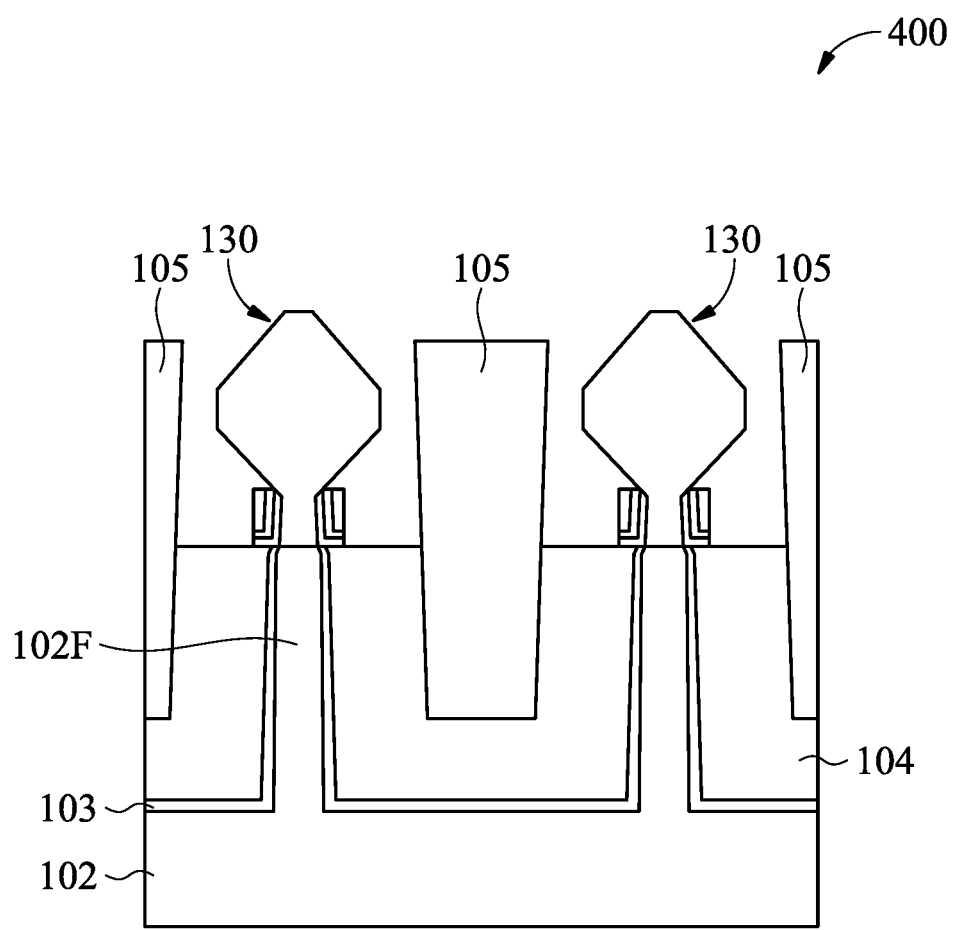

FIGS. 5A, 5B, 5C and 5D show cross-sectional views of respective intermediate structures at several stages of an exemplary method for fabricating a semiconductor device 400 taken along line II-II in FIG. 1, in accordance with some embodiments. Referring to FIG. 5A, an isolation fin 105 is formed in the isolation structure 104 and between the fin structures 114, in accordance with some embodiments. The isolation fin 105 can provide an additional isolation for the fins 102F and subsequently formed epitaxial source and drain structures 130 (FIG. 5C). The isolation fin 105 has a lower portion embedded in the isolation structure 104 and an upper portion protruding from the isolation structure 104. The longitudinal direction of the isolation fin 105 is parallel to the longitudinal direction of the fin structure 114. The isolation fin 105 is made of a dielectric material, for example silicon oxide, silicon nitride or silicon oxynitride. The isolation fin 105 may be formed using photolithography, etching and deposition processes. The top surface of the isolation fin 105 may be lower than, higher than or at the same level with the top surface of the fin stack 114S.

Next, a dummy gate dielectric layer 108, a first spacer layer 121 and a second spacer layer 122 in sequence are conformally deposited on the isolation fins 105, the isolation structure 104 and the fin stacks 114S, as shown in FIG. 5A in accordance with some embodiments. Afterwards, the dummy gate dielectric layer 108, the first spacer layer 121 and the second spacer layer 122 are patterned. In some embodiments, fin sidewall spacers 125 remain on the sidewalls of the fin stack 114S (FIG. 5A). The fin sidewall spacers 125 are constituted of remaining portion 108' of the dummy gate dielectric layer 108 and remaining portion 120' of the first spacer layer 121 and the second spacer layer 122. Then, the fin stacks 114S are removed to form recesses 126, as shown in FIG. 5B in accordance with some embodiments.

Referring to FIG. 5C, an epitaxial source and drain structure 130 is formed on the fin 102F and between the fin sidewall spacers 125, in accordance with some embodiments. The top surface of the epitaxial source and drain structure 130 may be higher than, lower than or at the same level with that of the isolation fin 105.

Figure 5D:
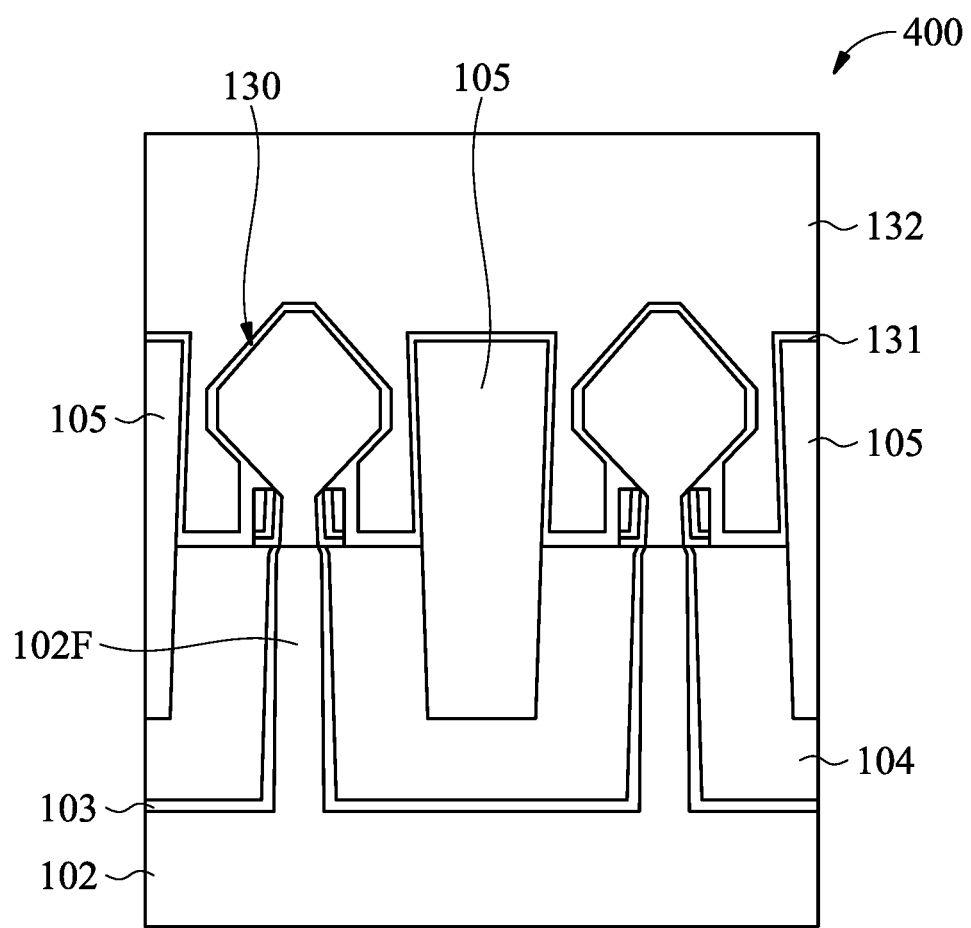

Next, referring to FIG. 5D, a contact etch stop layer (CESL) 131 is conformally deposited on the isolation fins 105, the isolation structure 104, the fin sidewall spacers 125 and the epitaxial source and drain structures 130, in accordance with some embodiments. Then, an interlayer dielectric (ILD) layer 132 is deposited on the CESL 131 and has a planar top surface. The materials and processes of forming the above mentioned features may be the same as or similar to those described with respect to FIGS. 2E-2 and 2F-2. In addition, the isolation fins 105 in the embodiments of the semiconductor device 400 of FIGS. 5A to 5D may be used in the embodiments of the semiconductor device 100 of FIGS. 2A-1 to 2I, the semiconductor device 200 of FIGS. 3A to 3G, and the semiconductor device 300 of FIGS. 4A to 4E.

According to the embodiments of the disclosure, the semiconductor devices having a GAA structure are fabricated with inner spacer last process. In some embodiments, portions of the second semiconductor layers 114S-2 are removed to form the recesses 128 in the fin stack 114S. Next, the third semiconductor layers 114S-3 are formed to fill the recesses 128. The sidewalk of the third semiconductor layers 114S-3 and the first semiconductor layers 114S-1 provide a continuous semiconductor surface with crystal orientation for epitaxially growing the epitaxial source and drain structures 130 to reduce defects produced during the epitaxial growth process. Afterwards, the second semiconductor layers 114S-2 are removed to form the spaces 133 between the first semiconductor layers 114S-1. Next, the third semiconductor layers 114S-3 exposed through the spaces 133 are oxidized to form the inner spacers 135. The inner spacers 135 are formed after the formation of the epitaxial source and drain structures 130. Therefore, the inner spacers 135 are not damaged by the etching and cleaning processes of forming the recesses 126 for the epitaxial source and drain structures 130. Afterwards, the replacement gate structure 140 is formed in the spaces 133 to surround the first semiconductor layers 114S-1 to be a GAA structure. According to the embodiments of the disclosure, the performance of the semiconductor devices is improved.

Moreover, in some other embodiments of the disclosure, the sidewall portions of the first semiconductor layers 114S-1 and the second semiconductor layers 114S-2 of the fin stack 114S are implanted with a dopant to form the doped portions 114d adjacent to the recesses 126 for the epitaxial source and drain structures 130. The doped portions 114d also provide a continuous semiconductor surface with crystal orientation for epitaxially growing the epitaxial source and drain structures 130 to reduce defects produced during the epitaxial growth process. Next, the second semiconductor layers 114S-2 are removed to form the spaces 133 between the first semiconductor layers 114S-1. The doped portions 114d exposed through the spaces 133 are oxidized to form the inner spacers 135 after the formation of the epitaxial source and drain structures 130. Therefore, the inner spacers 135 are not damaged by the etching and cleaning processes of forming the recesses 126 for the epitaxial source and drain structures 130. Afterwards, the replacement gate structure 140 is formed in the spaces 133 to surround the first semiconductor layers 114S-1 to be a GAA structure. According to the embodiments of the disclosure, the performance and fabrication of the semiconductor devices having the GAA structure with inner spacer last process are improved.

In some embodiments, a semiconductor device is provided. The semiconductor device includes a plurality of channel layers stacked over a semiconductor substrate and spaced apart from one another, a source/drain structure adjoining the plurality of channel layers, a gate structure wrapping around the plurality of channel layers, and a first inner spacer between the gate structure and the source/drain structure and between the plurality of channel layers. The first inner spacer is made of an oxide of a semiconductor material.

In some embodiments, a semiconductor device is provided. The semiconductor device includes a plurality of channel layers and a source/drain structure over a fin, a gate structure wrapping around the plurality of channel layers, a plurality of inner spacers between the gate structure and the source/drain structure, and a dopant portion between a first channel of the plurality of channel layers and the source/drain structure and between the plurality of inner spacers. A doped concentration of a dopant in the doped portion is greater than a doped concentration of the dopant in the channel layers.

In some embodiments, a semiconductor device is provided. The semiconductor device includes a fin protruding from a semiconductor substrate, an isolation structure surrounding the fin, and a plurality of channel layers separated from each other and disposed over the fin. The channel layers are made of a first semiconductor material. The semiconductor also includes a gate structure filling spaces between the channel layers and surrounding the channel layers, epitaxial source and drain structures disposed on opposite sides of the gate structure, and inner spacers disposed between the gate structure and the epitaxial source and drain structures. The inner spacers are made of an oxide of a second semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of channel layers and a source/drain structure over a fin;
    a gate structure wrapping around the plurality of channel layers;
    a plurality of inner spacers between the gate structure and the source/drain structure;
    a doped portion between a first channel of the plurality of channel layers and the source/drain structure and between a first inner spacer and a second inner spacer of the plurality of inner spacers, wherein a doped concentration of a dopant in the doped portion is greater than a doped concentration of the dopant in the channel layers, and the dopant is carbon, germanium or a combination thereof;
    a gate spacer alongside the gate structure, wherein the first inner spacer is a topmost one of the inner spacers, and the first inner spacer is interposed between the gate spacer and the doped portion and in direct contact with the both gate spacer and the gate structure; and
    a doped semiconductor layer directly below the plurality of inner spacers and the source/drain structure; and
    a silicon layer directly below the plurality of channel layers and over the fin, wherein a sidewall of the doped semiconductor layer is interfaced with a sidewall of the silicon layer.

2. The semiconductor device as claimed in claim 1, wherein the inner spacers are made of an oxide of $Si_{1-x}Ge_x$ and x is greater than about 0.4 and less than 1.

3. The semiconductor device as claimed in claim 1, wherein the inner spacers have a dielectric constant in a range from about 3.5 to about 7.0.

4. The semiconductor device as claimed in claim 1, further comprising:
    an isolation structure surrounding the fin; and
    an isolation fin including a lower portion embedded in the isolation structure and an upper portion protruding from the fin.

5. The semiconductor device as claimed in claim 4, wherein a longitudinal direction of the isolation fin is parallel to a longitudinal direction of the fin.

6. The semiconductor device as claimed in claim 1, wherein a top surface of the doped semiconductor layer is in direct contact with a bottom surface of a bottommost one of the inner spacers and a bottom of the source/drain structure.

7. The semiconductor device as claimed in claim 1, wherein the source/drain structure vertically overlaps a bottommost one of the inner spacers.

8. A semiconductor device, comprising:
    a plurality of first channel layers stacked over a semiconductor substrate and spaced apart from one another;
    a source/drain structure laterally adjacent to the plurality of first channel layers;
    a gate structure wrapping around the plurality of first channel layers; and
    a plurality of first doped portions sandwiched between the plurality of first channel layers and the source/drain structure;
    a second doped portion below the source/drain structure, wherein the plurality of first doped portions vertically overlaps the second doped portion; and a plurality of second channel layers stacked over the semiconductor substrate and spaced apart from one another, wherein the second doped portion is sandwiched between and in direct contact with a bottommost one of the first channel layers and a bottommost one of the second channel layers.

9. The semiconductor device as claimed in claim 8, further comprising:
a first inner spacer between the gate structure and the source/drain structure, wherein the first inner spacer is made of an oxide of a semiconductor material.

10. The semiconductor device as claimed in claim 9, wherein the semiconductor material is SiGe, Ge or SiGeC.

11. The semiconductor device as claimed in claim 9, further comprising:
a second inner spacer above the plurality of first doped portions and between the gate structure and the source/drain structure, wherein the second inner spacer is made of the oxide of the semiconductor material.

12. The semiconductor device as claimed in claim 8, wherein a dopant in the first doped portions includes carbon (C) or germanium (Ge).

13. The semiconductor device as claimed in claim 8, wherein the second doped portion is wider than the source/drain structure.

14. The semiconductor device as claimed in claim 8, further comprising:
a fin sidewall spacer surrounding a lower portion of the source/drain structure; and
a contact etch stop layer surrounding an upper portion of the source/drain structure and the fin sidewall spacer.

15. The semiconductor device as claimed in claim 8, wherein the second doped portion vertically overlaps a portion of a bottommost one of the plurality of first channel layers.

16. A semiconductor device, comprising:
a fin protruding from a semiconductor substrate;
an isolation structure surrounding the fin;
a plurality of channel layers separated from each other and disposed over the fin, wherein the channel layers are made of a first semiconductor material, and portions of the channel layers are implanted with a dopant, and the dopant comprises carbon, germanium or a combination thereof;
a gate structure filling spaces between the channel layers and surrounding the channel layers;
epitaxial source and drain structures disposed on opposite sides of the gate structure;
a doped semiconductor layer below one of the epitaxial source and drain structures, wherein a first channel layer is a bottommost one of the plurality of channel layers, a top surface and a bottom surface of the doped semiconductor layer are substantially leveled with a top surface and a bottom surface of the first channel layer, respectively; and
a plurality of inner spacers disposed between the gate structure and the epitaxial source and drain structures, wherein the inner spacers vertically overlap the doped semiconductor layer.

17. The semiconductor device as claimed in claim 16, wherein the inner spacers are made of an oxide of a second semiconductor material, the first semiconductor material is different from the second semiconductor material, the first semiconductor material comprises silicon or silicon germanium, and the second semiconductor material comprises silicon germanium or germanium.

18. The semiconductor device as claimed in claim 16, wherein the inner spacers are implanted with a dopant, and the dopant comprises carbon, germanium or a combination thereof.

19. The semiconductor device as claimed in claim 16, wherein doped portions of the channel layers implanted with the dopant are interfaced with undoped portions of the channel layers at a plurality of boundaries, the plurality of inner spacers have a plurality of sidewall interfaced with the gate structure, and the plurality of sidewalls are substantially aligned with the plurality of boundaries.

20. The semiconductor device as claimed in claim 16, further comprising:
an isolation fin disposed in the isolation structure and protruding from the isolation structure, wherein the isolation fin is parallel to the fin.

* * * * *